United States Patent [19]
Komatsu

[11] Patent Number: 5,251,176
[45] Date of Patent: Oct. 5, 1993

[54] DYNAMIC TYPE SEMICONDUCTOR MEMORY DEVICE WITH A REFRESH FUNCTION AND METHOD FOR REFRESHING THE SAME

[75] Inventor: Takahiro Komatsu, Hyogo, Japan

[73] Assignee: Mitsubishi Denki Kabushiki Kaisha, Tokyo, Japan

[21] Appl. No.: 750,793

[22] Filed: Aug. 27, 1991

[30] Foreign Application Priority Data

Aug. 29, 1990 [JP] Japan .................... 2-229085

[51] Int. Cl.$^5$ ............................................ G11C 7/00
[52] U.S. Cl. .......................... 365/222; 365/230.03; 365/230.02; 365/193; 365/229
[58] Field of Search ............. 365/222, 230.03, 233, 365/193, 205, 207, 208, 230.02, 227, 229

[56] References Cited

U.S. PATENT DOCUMENTS

| | | | |
|---|---|---|---|
| 4,222,112 | 9/1980 | Clemons et al. | 365/230.03 |
| 4,796,232 | 1/1989 | House | 365/189.03 |
| 4,933,907 | 6/1990 | Kumanoya et al. | 365/222 |
| 4,934,826 | 6/1990 | Miyatake et al. | 365/222 |

FOREIGN PATENT DOCUMENTS

| | | |
|---|---|---|
| 0325026 | 10/1988 | European Pat. Off. |
| 54-96333 | 7/1979 | Japan |

OTHER PUBLICATIONS

"Synchronous Memory Refresh Scheme Which Supports Several Refresh Rates Without Jumpers on Cards or Planars", IBM Technical Disclosure Bulletin, vol. 32, No. 88, Jan. 1990.

"A 64K Bit MOS Dynamic Ram with Auto/Self Refresh Functions", by Yamada et al, Institute of Electronics and Communication Engineers, Transactions (C), vol. 10–66C, No. 1, Jan. 1983, pp. 62–69.

Primary Examiner—Joseph A. Popek
Attorney, Agent, or Firm—Lowe, Price, LeBlanc & Becker

[57] ABSTRACT

A dynamic type semiconductor memory device includes m memory blocks each having a plurality of memory cells, and a plurality of sense amplifier groups associated with the respective memory blocks. Each sense amplifier group senses and amplifies data of a selected memory cell in the related memory block. The memory device further includes a circuit for generating a refresh instruction detecting signal in response to an externally applied refresh mode indicating signal, and circuitry responsive to a block designating signal and the refresh instruction detecting signal for activating each of the sense amplifier groups in such a manner that only start timings for the sensing operations of the sense amplifier groups related to the designated memory blocks may differ from each other. This activation circuitry activates the respective sense amplifier groups related to the memory blocks designated by the block designating signal in such a manner that their sensing operations may have the same start timing in the normal mode. This device significantly reduces current dissipation in the refresh mode, while the access time in the normal mode is not adversely affected. This device is suitable for use as an internal memory of a battery backup type computer because of its small load on the battery.

8 Claims, 16 Drawing Sheets

DYNAMIC TYPE SEMICONDUCTOR MEMORY DEVICE WITH A REFRESH FUNCTION AND METHOD FOR REFRESHING THE SAME

BACKGROUND OF THE INVENTION

1. Field of the Invention

The present invention relates to dynamic type semiconductor memory devices, and particularly relates to a construction and a method for refreshing information in memory cells.

2. Description of the Related Art

In recent years, personal computers have become popular among general users. Particularly, in the most recent years, demand has been increased for the personal computers of a portable type called as a lap-top type. These portable personal computers can be carried to any places, which is one of the features thereof. In view of actual usage, it is preferable to support a battery back-up function therein. The battery back-up function is such a function that data written in an internal memory can be held by a battery, for instance, during carriage thereof.

The portable personal computers have employed as the internal memories DRAM's (dynamic random access memories) or SRAM's (static random access memories). Particularly, the DRAM's which are inexpensive and have large storage capacities have been widely used as the internal memories.

The DRAM stores information by storing charges in a memory capacitor such as a MOS (metal insulator semiconductor) capacitor as shown in FIG. 1.

FIG. 1 schematically illustrates a construction related to a pair of bit lines in the DRAM. In FIG. 1, there is shown a bit line construction of a memory having a "folded bit line" construction as an example.

In FIG. 1, bit lines for having information transmitted thereon comprises a pair of bit lines BL and $\overline{BL}$ which transmit mutually complementary data. A memory cell M1 is disposed at an intersection between a word line WL1 and the bit line BL, and a memory cell M2 is disposed at an intersection between a word line WL2 and the complementary bit line $\overline{BL}$. The memory cell M1 includes a capacitor C1 storing an information in a form of charges and a transfer gate transistor T1 which connects the capacitor C1 to the bit line BL in response to a signal potential on the word line WL1. The memory cell M2 includes a capacitor C2 storing an information in a form of charges and a transfer gate transistor T2 which connects the capacitor C2 to the complementary bit line $\overline{BL}$ in response to a signal potential on the word line WL2.

The paired bit lines BL and $\overline{BL}$ are associated with a sense amplifier SA which is responsive to a sense amplifier activating signal $\phi$ for differentially sensing and amplifying the signal potentials on the bit line pair BL and $\overline{BL}$.

Between the bit lines BL and $\overline{BL}$ and I/O lines I/O and $\overline{I/O}$, there are respectively provided I/O gate transistors IG1 and IG2, which are selectively turned on in response to a column selecting signal (column decode signal) Y.

Each of the word lines WL1 and WL2 has connected thereto memory cells of one row. The bit line pair BL and $\overline{BL}$ has connected thereto memory cells of one column. In operation of the memory, a word line (e.g., WL1) is selected by a row decoder (not shown) in response to an externally applied row address signal.

When the word line WL1 is selected, the transfer gate transistor T1 in the memory cell M1 is turned on, and the capacitor C1 is connected to the bit line BL.

Then, the sense amplifier SA is activated at a predetermined timing in response to the sense amplifier activating signal $\phi$ to differentially sense and amplify the potential difference between the bit lines BL and $\overline{BL}$. After the sense amplifier SA completes the sensing operation and the potential on the bit lines BL and $\overline{BL}$ are sufficiently developed, the I/O gate transistors IG1 and IG2 become conductive in response to the column selecting signal Y from a column decoder (not shown), and thus the bit lines BL and $\overline{BL}$ are connected to the I/O lines I/O and $\overline{I/O}$, respectively. In the data writing operation, a data transmitted through the I/O line I/O is written in this selected memory cell M1.

In the data reading operation, the signal potentials on these I/O lines I/O and $\overline{I/O}$ are read out, as an output data, through a preamplifier, output buffer and others, all of which are not shown.

As described above, since the DRAM stores the information in the capacitors, the stored charges in the capacitors tend to be gradually discharged due to a leak current. In order to prevent destruction of the stored information through the discharge of the stored charges from the capacitors, periodical restoration of the contents of the memory cells are required for compensating for the discharge of the stored charges caused by the leak current. This operation is called as refresh. In the DRAM, this refresh operation is periodically performed with respect to respective word lines.

This refresh operation is also required for the battery back-up operation in the portable personal computer described above so as to hold the memory contents.

There are several refresh modes of DRAM, such as $\overline{RAS}$ only refresh mode and $\overline{CAS}$ before $\overline{RAS}$ refresh mode.

FIG. 2 illustrates signal waveforms in the $\overline{RAS}$ only refresh mode. With reference to FIG. 2, the $\overline{RAS}$ only refresh operation will now be briefly described.

A refresh address counter, which is provided at an exterior of the memory and is controlled by instructions, e.g., from CPU, applies a refresh address to the DRAM. Then, an address Q0-Qn for this refresh is accepted in the memory at a falling edge to "L" of a row address strobe signal $\overline{RAS}$. At this time, a column address strobe signal $\overline{CAS}$ as well as a read/write signal $\overline{W}$ for controlling read and write of the memory can take arbitrary states. FIG. 2 illustrates an example in which both of them are set at "H". A corresponding word line in the memory is selected by the refresh address Q0-Qn, and the information in the memory cell connected to this selected word line is read to the related bit line. After elapse of a predetermined period of time from the falling edge of the row address strobe signal $\overline{RAS}$, the sense amplifier activating signal $\phi$ rises to activate the sense amplifier SA. Consequently, the information read out from the memory cell is amplified, and the amplified data is written in the same memory cell, i.e., memory cell from which the information has been read out.

In this refresh mode, the column address decode signal is not generated, so that the I/O gate transistors IG1 and IG2 (see FIG. 1) is kept in an off state. As described above, the data amplified by the sense amplifier SA is written in the same memory cell for refreshing the information in the memory cell (in this case, the memory cells connected to one word line).

In this $\overline{RAS}$ only refresh mode, if the column address strobe signal $\overline{CAS}$ is set at the active state of "L" after the refresh instruction, and the read/write signal $\overline{W}$ is set in either the read enable mode or the write enable mode, the operation can immediately turns from the refresh mode into the normal read or write mode.

As the refresh of a DRAM, there have been functions called as self-refresh function and auto-refresh function with the above refresh function supported inclusive in a DRAM.

FIG. 3 is a block diagram illustrating a construction of a refresh circuit in DRAM containing the refresh function with which refresh addresses are internally generated. The refresh circuit shown in FIG. 3 is disclosed in an article "A 64K bit MOS Dynamic RAM with Auto/Self refresh functions" by Yamada et al., Institute of Electronics and Communication Engineers, Transactions (C), Vol. 10-66C, No. 1, January 1983, pp 62-69.

Referring to FIG. 3, the refresh circuit includes a refresh control circuit 101 which generates various control signals in response to an externally applied refresh instruction signal $\overline{REF}$, a timer 102 which generates a refresh request signal REFREQ for a predetermined time in response to an activating signal from the refresh control circuit 101, a refresh address counter 103 which generates refresh address signals for designating a row to be refreshed, and a multiplexer 104 which allows selective passage of one of externally applied address signals A0-An and the refresh address signals Q0-Qn in response to switching control signals MUX and $\overline{MUX}$ from the refresh control circuit 101. The refresh address counter 103 increments its count by "1" in response to a word line clock signal $\phi w$ from a RAS control circuit 105 described later. The word line clock signal $\phi w$ provides a timing for setting a word line in the selected state. The potential of the selected word line rises at the timing of this word line clock signal $\phi w$.

The refresh circuit also includes the RAS control circuit 105 which generates an internal row address strobe signal Int.RAS for controlling the operations of row selecting circuitry, and a CAS control circuit 106 which generates an internal column address strobe signal Int.CAS for controlling the operations of column selecting circuitry. The RAS control circuit 105 includes at its input a NAND gate 107 for receiving a control signal $\overline{MUX'}$ from the refresh control circuit 101 and the externally applied row address strobe signal $\overline{RAS}$. The CAS control circuit 106 includes at its input a NOR gate 108 for receiving a column selection operation inhibiting signal CASIHT from the refresh control circuit 101 and the column address strobe signal $\overline{CAS}$. The $\overline{RAS}$ control circuit 105 also generates a signal for activating the CAS control circuit 106 in response to the externally applied row address strobe signal $\overline{RAS}$.

The address signals from the multiplexer 104 are applied to the address buffer 109. The address buffer 109 in response to the internal row address strobe signal Int.RAS from the RAS control circuit 105 to accept the applied address signals for generating the internal row address signals which in turn are applied to the row address decoder. The operations of the refresh circuit shown in FIG. 3 will be described with reference to FIG. 4 illustrating operation waveforms thereof. This refresh circuit can perform the operations both of the auto-refresh and the self-refresh. FIG. 4 illustrates the operation waveforms in the auto-refresh operation.

When a RAS precharge time $t_d$ (RAS-REF) elapses after the signal $\overline{RAS}$ rises from "L" to "H" to set the memory in the standby state, the refresh instruction signal $\overline{REF}$ is allowed to fall from "H" to "L". This RAS precharge time is a time required for precharging the sense amplifier circuitry.

The auto-refresh is started by falling the refresh instruction signal $\overline{REF}$ from "H" to "L" at a time t0. The refresh control circuit 101, in response to this activated refresh instruction signal $\overline{REF}$, sets the switch control signal MUX to "H" and the complementary switch control signal $\overline{MUX}$ to "L" before a time t1. In response to these switch control signals MUX and $\overline{MUX}$, the multiplexer 104 selects the refresh address signals Q0-Qn sent from the refresh address counter 103 and transmits them to the address buffer 109.

After generating these switch control signals MUX and $\overline{MUX}$, the refresh control circuit 101 generates a signal MUX', delayed by a predetermined time to the signal MUX and applies it to the NAND gate 107. This control signal $\overline{MUX'}$ is currently in the active state of "L", so that an output of the NAND gate 107 is "H". In response to the signal at "H" from the NAND gate 107 the RAS control circuit 105 generated the internal row address strobe signal Int.RAS (time t1).

In order to prevent the mutual interference between the externally applied address signals A0-An and the refresh address signals Q0-Qn, it is designed to prevent the switch control signals MUX and $\overline{MUX}$ from having their "H" level period overlapping with each other (the address signals corresponding to the switch signal at "H" are passed).

The signal $\overline{MUX'}$ is delayed by the predetermined time relative to the signal $\overline{MUX}$ for the purpose that the activation time of the address buffer 109 can be surely set at a time after the completion of the multiplexing operation of the multiplexer 104.

The word line clock signal $\phi w$ is generated at a time t2 with a delay by a predetermined time after the RAS control circuit 105 generates the internal row address strobe signal Int.RAS. Thereby, the word lines designated by the refresh addresses Q0-Qn are set at the selected state.

Then, the word line clock signal $\phi w$ increments by "1" the count of the refresh address counter 103 (between times t2 and t3).

Meanwhile, upon generation of the refresh instruction signal, the signal CASIHT for inhibiting the column selecting operation is set at "H" by the refresh control circuit 101 and is applied to the NOR gate 108. In this operation, the output of the NOR gate 108 is "L", and the CAS control circuit 106 maintains the internal column address strobe signal Int.CAS at "L". Thereby, the column selection operation is not performed.

At the time t3 after the rising of the word line clock signal $\phi w$ to "H", the sense amplifier activating signal (signal $\phi$ in FIG. 1) is generated and thus the sense amplifier is activated. The sense amplifier senses and amplifies the information in a memory cell connected to the selected word line, and storing of the information in the same memory cell, i.e., refresh, is performed.

At a time t4, the refresh end signal REFEND is generated from the RAS control circuit 105 and is applied to the refresh control circuit 101. This refresh end signal REFEND is generated when a predetermined time elapses after the generation of the word line clock signal $\phi_w$. The refresh control circuit 101 raises the signal $\overline{\text{MUX}}'$, from "L" to "H" in response to this refresh end signal REFEND. In response thereto, the output of the NAND gate 107 changes to "L". Accordingly, the internal row address strobe signal Int.RAS from the RAS control circuit 105 falls from "H" to "L". The sense amplifier circuitry starts to be precharged and is brought to the condition ready for the next memory operation or the refresh operation.

A period of time $t_d$ (REF-RAS) from the termination of the refresh to the start of the normal memory cycle is a period of time required from completion of the precharging of the sense amplifier circuitry to the start of the standby state of the memory.

A period of time $t_{su}$ (REF-RAS) shown in FIG. 4 is a period of time required from the start of an auto-refresh to the return to a normal memory operation.

In the refresh circuit shown in FIG. 3, when the refresh instruction signal $\overline{\text{REF}}$ is externally applied, the refresh addresses are automatically and internally generated to perform and complete the refresh. This refresh circuit further includes a self-refresh function with which the refresh is automatically and repeatedly performed as long as the signal $\overline{\text{RAS}}$ is "H" and the refresh instruction signal $\overline{\text{REF}}$ is "L". FIG. 5 illustrates an operation waveform in this self-refresh mode. This self-refresh operation will now be described with reference to FIGS. 3 and 5.

As can be understood from the comparison of the operation timing diagram of the auto-refresh shown in FIG. 4 and that of the self-refresh shown in FIG. 5, the auto-refresh and the self-refresh are similar to each other. Difference between them is a hold time Tw (REFL) for holding the refresh instruction signal REF at "L". The self-refresh starts at a time S0 at which the self-refresh instruction signal $\overline{\text{REF}}$ changes from "H" to "L". The internal operation between the times S0 and S1 proceeds in the same manner as that for the auto-refresh. That is, there is no distinction between the auto-refresh and the self-refresh until the time S1.

At the time S1, i.e., upon completion of the first refresh operation, the timer 102 is activated in response to the signal from the refresh control circuit 101. If the refresh instruction signal $\overline{\text{REF}}$ is held at "L" for a period exceeding a set time Tset (usually 12–15 μs) predeterminedly set in the timer 102, a refresh request signal REFREQ is generated by the timer 102 and is applied to the refresh control circuit 101. In response thereto, the refresh operation restarts, and, the refresh is performed for the memory cells which is selected by the refresh address incremented by one bit as compared with that at the time S0. Before a time S3, the refresh address of the refresh address counter 103 is further incremented by one bit.

This operation is repeatedly performed as long as the signal $\overline{\text{RAS}}$ is at "H" and the signal $\overline{\text{REF}}$ is held at "L".

In FIGS. 4 and 5, the word line clock signal $\phi_w$ is once raised to "H" level and subsequently is further raised for the purpose that, after a word line is selected and the sense amplifier is activated, the word line potential may be further raised for ensuring the writing of the level "H" amplified by the sense amplifier in the memory cell. The reason why the output Nst from the timer (see FIG. 5(g)) gradually decreases is that the timer 102 indicates the time by means of a discharge potential of the capacitor.

The self-refresh operation is performed asynchronously to the input of the refresh instruction signal $\overline{\text{REF}}$. Therefore, at an instant at which the refresh instruction signal $\overline{\text{REF}}$ returns from "L" to "H" for the change from the self-refresh to the normal memory operation, it is impossible to identify the state to which the internal refresh operation has advanced when interrupted. Therefore, while the refresh request signal REFREQ is generated, it is necessary to inhibit the application of the refresh instruction signal $\overline{\text{REF}}$. Owing to this construction, when the refresh instruction signal $\overline{\text{REF}}$ returns from "L" to "H" at a time between the times S3 and S4, the self-refresh terminates at that time point. If the refresh instruction signal $\overline{\text{REF}}$ returns from "L" to "H" at a time between the times S4 and S5, the termination of the self-refresh is postponed to a time S6 of termination of the refresh operation.

If the self-refresh instruction signal $\overline{\text{REF}}$ returns from "L" to "H" at a time between the times S5 and S6, the termination of the self-refresh is also postponed to the time S6.

As described above, due to asynchronous characteristics of the self-refresh, a period of time for one cycle should be reserved as the period of time $t_d$ (REF-RAS) between the change of the refresh instruction signal $\overline{\text{REF}}$ from "L" to "H" and the subsequent change of the signal $\overline{\text{RAS}}$ from "H" to "L".

As described above, the auto-refresh mode and the self-refresh mode are operation modes for performing only the refresh, and thus, in order to perform the memory operation for a normal writing or reading of the memory, it is necessary to lower the signal $\overline{\text{RAS}}$ to "L" after the setting of the refresh instruction signal $\overline{\text{REF}}$ to "H" and simultaneously to apply address signals from an exterior.

In addition to the constructions for externally applying the refresh instruction signal $\overline{\text{REF}}$ as described above, there is provided an operation mode called as a $\overline{\text{CAS}}$ before $\overline{\text{RAS}}$ refresh using the signals $\overline{\text{RAS}}$ and $\overline{\text{CAS}}$ as the refresh instruction signals. This is an operation mode in which the refresh is designated by the condition in which the external signal $\overline{\text{CAS}}$ is already in the active state of "L" at the time of falling of the external signal $\overline{\text{RAS}}$.

FIG. 6 illustrates a construction of the refresh instruction signal generating circuit for achieving the $\overline{\text{CAS}}$ before $\overline{\text{RAS}}$ refresh mode. In FIG. 6, this $\overline{\text{CAS}}$ before $\overline{\text{RAS}}$ refresh instruction signal generating circuit includes a CAS before RAS detecting circuit 150 and an instruction signal generating circuit 160 for generating the refresh instruction signal $\overline{\text{REF}}$ in response to an output of the detecting circuit 150.

The CAS before RAS detecting circuit 150 includes NAND gates G1 and G2 as well as inverters G3, G4 and G5. The inverter G3 inverts the externally applied signal $\overline{\text{RAS}}$ and generates an inverted delay signal $\phi_R$. The inverter G4 inverts the externally applied signal $\overline{\text{CAS}}$ and generates an inverted delay signal $\phi_C$.

The NAND gate G1 receives the signal $\phi_R$ and an output of the NAND gate G2. The NAND gate G2 receives the signal $\phi_C$ and an output of the NAND gate G1. The inverter G5 inverts the output of the NAND gate G2 and generates the CAS before RAS detecting signal CBR.

The refresh instruction signal generating circuit 160 receives the signal $\phi_R$ from the inverter G3 and the CAS before RAS detecting signal CBR from the inverter G5. Operations thereof will be described with reference to FIGS. 7 and 8 illustrating the operation waveforms thereof. First, referring to FIG. 7, a normal operation cycle for normal read and write of the data will be described.

When both the signals $\overline{RAS}$ and $\overline{CAS}$ are "H" and thus the memory (DRAM) is in the standby state, both the signals $\phi_R$ and $\phi_C$ from the inverters G3 and G4 are "L". Therefore, both the outputs from the NAND gates G1 and G2 are "H".

Falling of the signal $\overline{RAS}$ causes the memory operation to start. In response thereto, the signal $\phi_R$ from the inverter G3 rises to "H". Since the output signal of the NAND gate G2 is currently "H", the output of the NAND gate G1 lowers to "L" in response to the rising of the signal $\phi_R$. At this time, since the signal $\overline{CAS}$ is still "H", the signal $\phi_C$ is "L" and the output of the NAND gate G2 is still "H".

When the signal $\overline{CAS}$ lowers to "L" thereafter, the signal $\phi_C$ from the inverter G4 rises to "H". In this time, since the output of the NAND gate G1 is "L", the output $\overline{CBR}$ of the NAND gate G2 maintains "H".

When the signals $\overline{CAS}$ and $\overline{RAS}$ rise to "H" after the completion of one memory cycle, the respective signals $\phi_R$ and $\phi_C$ lower to "L". In response to the lowering of the signal $\phi_R$ to "L", the potential of the node N1 (i.e., output of the NAND gate G1) rises to "H".

Since the signal $\overline{RAS}$ normally rises to "H" after the rising of the signal $\overline{CAS}$, both the signal $\phi_C$ and the potential of the node N1 do not become "H" at the same time, and thus the output of the NAND gate G2 maintains "H".

Therefore, the output signal CBR of the inverter G5 is fixed to "L" in this normal operation cycle. The NAND gate G6 receives this signal CBR and the signal $\phi_R$. Since the signal CBR is "L", the refresh instruction signal $\overline{REF}$ is fixed to "H", and thus the refresh instruction signal is not generated.

Then, the refresh operation will be described with reference to FIG. 8. In the $\overline{CAS}$ before $\overline{RAS}$ refresh mode, the signal $\overline{CAS}$ lowers to "L" prior to the falling of the signal "RAS". In the initial state, i.e., in the standby state, the outputs of the NAND gates G1 and G2 are "H". When the signal $\overline{CAS}$ lowers to "L", the signal $\phi_C$ rises to "H". Thereby, the output of the NAND gate G2 lowers to "L", and the signal CBR from the inverter G5 rises to "H". In this time, the signal $\phi_R$ is still "L", so that the output signal $\overline{REF}$ of the NAND gate G6 is still "H".

When the signal $\overline{RAS}$ lowers to "L" in this condition, the signal $\phi_R$ rises to "H". In response to the rising of the signal $\phi_R$ to "H", the output signal $\overline{REF}$ of the NAND gate G6 lowers to "L". The refresh instruction is provided by this lowering of the signal $\overline{REF}$ to "L".

When the signal $\overline{CAS}$ rises to "H", the signal $\phi_C$ lowers to "L". In response thereto, the output signal $\overline{CBR}$ of the NAND gate G2 also rises to "H". The signal $\phi_R$ is in the state of "H" because the signal $\overline{RAS}$ is still "L" at this time.

The signal CBR from the inverter G5 lowers to "L" in response to the rising of the output signal from the NAND gate G2 to "H". Therefore, the output signal $\overline{REF}$ of the NAND gate G6 rises to "H" in response to the lowering of the signal CBR to "L". This indicates the termination of the refresh.

Thereafter, the signal $\overline{RAS}$ rises to "H" and the signal $\phi_R$ lowers to "L", whereby one refresh operation is completed.

In this $\overline{CAS}$ before $\overline{RAS}$ refresh mode, the refresh cycle period is determined by a period for which the signal $\overline{CAS}$ is at the "L" level. Therefore, the period for the self-refresh is determined by the period during which the signal $\overline{CAS}$ is at the "L" level.

The construction of the refresh circuit for the $\overline{CAS}$ before $\overline{RAS}$ refresh mode is slightly different from that in FIG. 3, in the point that the NAND gate 107 in FIG. 3 is eliminated and the $\overline{RAS}$ signal is directly transmitted to the $\overline{RAS}$ control circuit 105.

Also in this $\overline{CAS}$ before $\overline{RAS}$ mode, the operation cycle thereof provides an operation mode performed only for the refresh, and it is necessary to sequentially lower the signals $\overline{RAS}$ and $\overline{CAS}$ to "L" in a predetermined order after the change to the standby state and to apply the address, for performing the normal operation cycle again.

In view of reduction of the power consumption of the semiconductor memory device, there has been generally used a semiconductor memory device of a block division type, in which a memory cell array is divided into a plurality of blocks, and only the block related to an applied address among the memory cell blocks is selected to be driven. This construction has been employed in view of a fact that a current caused by the charging and discharging of bit lines during the operation of the sense amplifier bears a considerably high ratio to a total current consumption of DRAM. That is, in the normal operation, only a sense amplifiers which are associated with the memory cells of the block related to the externally applied signal are activated, and the sense amplifiers related to the remaining blocks are maintained in an inactive or standby state, whereby the charge and discharge currents of the bit lines are reduced, resulting in reduction of the total current consumption of the DRAM.

FIG. 9 schematically illustrates a construction of a conventional semiconductor memory device having a memory capacity of 1 Mbits. Referring to FIG. 9, a memory cell array 1 is divided into 8 memory cell blocks MA1-MA8. Each of the memory cell blocks MA1-MA8 includes memory cells disposed in 256 rows by 512 columns. These memory cell blocks MA1-MA8 are grouped into two groups based on the highest order address bit RA8 of a row address. Specifically, one of the groups includes the memory cell blocks MA1, MA2, MA5 and MA6 having the highest order address bit RA8 of "0" and the other group includes the memory cell blocks MA3, MA4, MA7 and MA8 having the highest order row address bit RA8 of "1".

Sense amplifier groups SA1-SA8 are associated with the memory cell blocks MA1-MA8, respectively. Each of the sense amplifier groups SA1-SA8 includes sense amplifiers which are associated with respective bit line pairs of the corresponding memory cell block and are operable to differentially detect and amplify signal potential differences on the respective bit line pairs.

There are provided column decoders CD1-CD4, each of which is associated with adjacent two memory cell blocks for selecting columns in each associated memory cell block. The column decoder CD1 selects one column in each of the memory cell blocks MA1 and MA2. The column decoder CD2 selects one column in each of the memory cell blocks MA3 and MA4. The column decoder CD3 selects one column in each of the memory cell blocks MA5 and MA6. The column decoder CD4 selects one column in each of the memory cell blocks MA7 and MA8.

A row decoder 2 is provided for selecting a row in the memory cell array 1. The row decoder 2 selects a row in the eight memory cell block MA1-MA8. More specifically, it selects one row in each memory cell block included in either of the two groups according to the highest order row address bit RA8.

An address buffer 3 is provided for applying row address signals and column address signals to the row decoder 2 and the column decoders CD1-CD4, respectively. The address buffer 3 receives externally applied address signals A0-A8 to generate internal address signals RA0-RA8 and internal column address signals CA0-CA8. The row signals and column address signals are applied to the address buffer 3 in a time division multiplexing manner. Timings for latching these row address signals and column address signals are set by the externally applied control signals $\overline{RAS}$ and $\overline{CAS}$.

A sense amplifier activating signal generating circuit 4 is provided for activating only the sense amplifier group which is associated with the memory cell blocks including the word lines selected by the row decoder 2. The sense amplifier activating signal generating circuit 4 activates either the sense amplifier activating signal $\phi 0$ or $\phi 1$ in response to an internal control signal Int.RAS generated by a control signal generating circuit 5 and the highest order address bit RA8 from the address buffer 3. When the internal row address signal bit RA8 is "0", the activating signal $\phi 0$ for the sense amplifier groups SA1, SA2, SA5 and SA6 is activated. When the highest order address signal bit RA8 is "1", the activating signal $\phi 0$ for activating the sense amplifier groups SA3, SA4, SA7 and SA8 is activated.

In this construction, since the column decoders CD1-CD4 select the data of four columns, i.e., of four bits, there is further provided an I/O buffer circuit 6 having a function for selecting one bit from the data of 4 bits. The I/O buffer circuit 6 responds to the highest order row and column address signal bits RA8 and CA8 for selecting only one bit in the selected four bits to couple that bit with the external of the device.

The control signal generating circuit 5 generates various internal control signals in response to the externally applied signals $\overline{RAS}$, $\overline{CAS}$ and $\overline{W}$. In the construction shown in FIG. 9, there is however represented only the internal signal Int.$\overline{RAS}$ related to the activation of the sense amplifiers.

If the signal $\overline{W}$ is at "L" and thus indicates the data writing, the I/O circuit 6 transmits an externally applied data to a selected memory cell. If the signal $\overline{W}$ is at "H" and thus indicates the data reading, one bit data among the selected four bit data is outputted as the output data. The construction for selecting only one bit among the four bits is employed for the semiconductor memory device having a "×1" construction. If it has a "×4" bit construction, the I/O circuit 6 will operate to give and receive the applied memory cell data of 4 bits to and from the external of the device.

FIG. 10 is a view showing a specific construction of the sense amplifier activating signal generating circuit 4 shown in FIG. 9. In FIG. 10, the sense amplifier activating signal generating circuit 4 includes a delay circuit 10 which delays the internal signal Int.$\overline{RAS}$ by a predetermined time to generate a sense amplifier drive signal $\phi x$, and a multiplexer circuit 11 which uses the highest order row signal bit RA8 to select a transmission path for outputting the sense amplifier drive signal $\phi x$ from the delay circuit 10.

The multiplexer circuit 11 includes a gate circuit G10 which receives at it false input the highest order row address signal bit RA8 and receives at its true input the sense amplifier drive signal $\phi x$, and a gate circuit G11 which receives at its one input the highest order address signal bit RA8 and receives at its other input the sense amplifier drive signal $\phi x$. When the highest order row address signal bit RA8 is "0", i.e., if its potential is "L", the gate circuit G10 is enabled, and the sense amplifier activating signal $\phi 0$ is generated in response to the sense amplifier drive signal $\phi x$.

If the highest order row address signal bit RA8 is "1", the gate circuit G11 is enabled, and the sense amplifier activating signal $\phi 1$ is generated in response to the sense amplifier drive signal $\phi x$. Now, operations of the semiconductor memory device shown in FIGS. 9 and 10 will be briefly described with reference to FIG. 11 which is an operation waveform diagram thereof.

In the normal cycle, i.e., for the reading or writing of the data, the externally applied signal $\overline{RAS}$ first falls to "L". Thereby, the memory cycle starts and the address buffer 3 latches the externally applied address signals A0-A8 as the row address signals and applies them to the row decoder 2. In response to this external signal $\overline{RAS}$, the control signal generating circuit 5 generates the internal signal Int.RAS. The internal control signal Int.$\overline{RAS}$ actives the operation of the row selection circuitry and the row decoder 2 decodes the applied internal row address signals RA0-RA8 to select the rows corresponding to the row address signals. In the construction shown in FIG. 9, one row is selected in each of the four blocks. The data in the memory cells connected to the selected word lines are transmitted to the bit lines. When the potential difference on the bit lines increases to a certain value, then the sense amplifier activating signal generating circuit 4 generates the sense amplifier activating signal $\phi 0$ or $\phi 1$, and the minute potential differences on the bit lines are further amplified differentially. After the potentials on the bit lines are settled to be "H" and "L", respectively, the column decoders CD1-CD4 select one column in each block, i.e., select a total of four columns in response to the internal column address CA0-CA8 received from the address buffer 3 and the selected columns are connected to the I/O circuit 6. The I/O circuit 6 selects one column from these selected four columns and connects it to the external of the device. Here, the actually activated column decoder among those CD1-CD4 is a column decoder which is associated with the memory cell block including the selected row.

As described above, the eight memory cell blocks are grouped into two groups, and only the sense amplifier groups corresponding to the memory cell blocks in one group are driven, whereby the charge and discharge current in the sensing operation can be reduced by half as compared with the case in which the sense amplifier groups in all the blocks are driven, resulting in reduction of the current consumption and the reduction of the peak current. The reduction of the peak current can also reduce the amount of current flowing to the substrate in the sensing operation, and thus it is possible to avoid disadvantages such as destruction of the memory cell data, for example, due to generation of holes by impact ionization which may be caused by the substrate current flowing from the power supply line to the substrate and variation of the substrate potential. This ensures more stable operations of the semiconductor memory device.

In the semiconductor memory device with the refresh mode such as the conventional $\overline{CAS}$ before $\overline{RAS}$ refresh cycle, the amount of the bit line charge and discharge current in the refresh operation of one cycle is the same as that in the normal operation, and thus, with respect to the peak current and the current consumption, the refresh operation is similar to the normal operation.

As shown in FIG. 12, in the memory system of a computer, a large number of semiconductor memory devices (memory IC's) MIC are arranged on a memory board 50. FIG. 12 illustrates an example in which twelve semiconductor memory devices (memory IC's) MIC are arranged on the memory board 50. The arrangement of the plurality of semiconductor memory devices on the memory board 50 allows a memory system, i.e., address space, to have a large capacity, using the memory cell devices of small capacities. This memory board 50 is connected to a data bus of the computer through a connector 51.

In this memory system, although it depends on the construction of the memory system, a construction of one word with a plurality of bits is achieved by simultaneously reading the data from the plurality of memory IC's in such a case that one semiconductor memory device MIC has a ×1 bit construction.

Further, in the memory system described above, a memory bank construction is employed in which predetermined number of semiconductor memory devices are used as one bank. Address spaces A, B and C are allotted to each bank, as shown in FIG. 13, and an address space having a large capacity is achieved, using the semiconductor memory devices having substantially small capacities, by selecting the banks correspondingly to the respective address spaces. FIG. 13 illustrates an example in which the semiconductor memory devices MIC1–MIC4 are used for the address space A, the semiconductor memory devices MIC5–MIC8 are used for the address space B, and the semiconductor memory devices MIC9–MIC12 are used for the address space C.

In the memory system described above, a major part of the semiconductor memory devices are in a data hold state, and only a part of the semiconductor memory devices are accessed for reading or writing the data. Therefore, with respect to the peak current in the normal operation, it is necessary to consider the peak current in the semiconductor memory devices which are actually accessed. However, in the refresh operation, all of the memories for the data storage are refreshed simultaneously, so that the peak current in the refresh operation has a value remarkably larger than that in the normal operation, and the current consumption, and particularly peak current, in the refresh operation cause a remarkable problem in the personal computer of the battery back-up type which requires a remarkably low current consumption.

In the personal computers having the battery back-up function and adapted to perform the refresh during the back-up by the battery, and particularly in the personal computers using the semiconductor memory devices with the refresh function, since all of the semiconductor memory devices in the system simultaneously perform the refresh operation, the peak current during the refresh is large and thus the current consumption of the battery is large, which causes remarkable consumption of the battery during the battery back-up, and thus the battery back-up function cannot be sufficiently accomplished.

SUMMARY OF THE INVENTION

An object of the invention is to provide a dynamic type semiconductor memory device capable of reducing a load on a power supply for a memory system.

Another object of the invention is to provide a semiconductor memory device capable of reducing a current consumption and particularly a peak current in a refresh operation.

Still another object of the invention is to provide a refresh method for a dynamic type semiconductor memory device capable of reducing a current consumption.

A dynamic type semiconductor memory device according to the invention comprises m memory cell blocks, each having a plurality of memory cells; a plurality of sense amplifier groups associated with the respective memory cell blocks for sensing and amplifying the information of the selected memory cells in the associated memory cell blocks; and sense amplifier activating means responsive to a refresh instruction detecting signal and a block selecting signal for activating the sense amplifier groups associated with the memory cells blocks designated by the block selecting signal.

The block selecting signal simultaneously designates n memory cell blocks among the m memory cell blocks, wherein n and m are integers and have a relationship of $n \leq m$.

The sense amplifier activating means includes means for activating the sense amplifier groups associated with the n memory cell blocks selected by the block selecting signal at respective different timings, only when the refresh instruction detecting signal is active to indicate the refresh.

In the invention, only when the refresh instruction detecting signal is active and the refresh cycle is designated in the semiconductor memory device, the sense amplifier groups are activated at the timings which are different for the respective memory cell blocks. This enables dispersion of the current caused by the charge and discharge of the bit lines in the refresh operation, and thus the peak current can be made smaller than that in the normal operation cycle.

These and other objects and features of the invention will become more apparent from the following description of preferred embodiments with reference to the accompanying drawings.

DETAILED DESCRIPTION OF THE PREFERRED EMBODIMENTS

Figure 14:
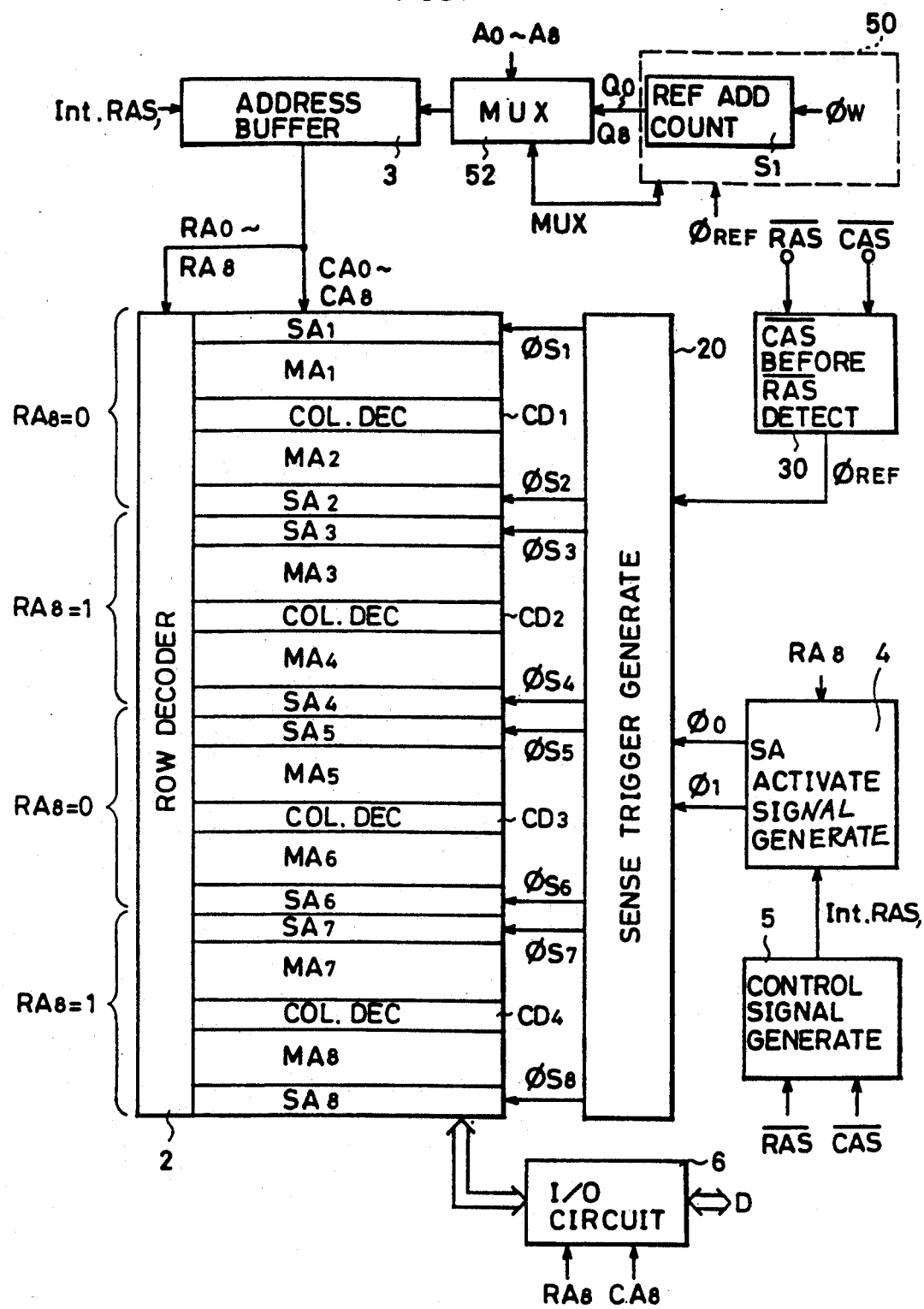
FIG. 14 schematically illustrates a whole construction of a dynamic type semiconductor memory device according to an embodiment of the invention.

FIG. 14 schematically illustrates a whole construction of a dynamic type semiconductor memory device according to an embodiment of the invention.

The dynamic type semiconductor memory device shown in FIG. 14 includes a memory cell array 1 having a memory capacity of 1 Mbits, which is divided into 8 memory cell blocks MA1-MA8. Each of the memory cell blocks MA1-MA8 includes memory cells arranged in a matrix form of 256 rows by 512 columns.

A row decoder 2 and column decoders CD1-CD4 are arranged for selecting the rows and columns in the memory cell array 1. The row decoder 2 receives internal row address RA0-RA8 applied from an address buffer 3, and selects word lines in 4 blocks in accordance with a highest order address bit RA8. The memory cell blocks MA1-MA8 are grouped into two groups based on the highest order row address bit RA8. The memory cell blocks MA1, MA2, MA5 and MA6 include the word lines of which highest order address signal bits RA8 are "0", and the memory cell blocks MA3, MA4, MA7 and MA8 includes the word lines of which highest order address signal bits RA8 are "1".

The column decoders CD1-CD4 each are associated with two memory cell blocks. The column decoder CD1 is provided for the memory cell blocks MA1 and MA2, and the column decoder CD2 is provided commonly for the memory cell blocks MA3 and MA4. The column decoder CD3 is provided commonly for the memory cell blocks MA5 and MA6, and the column decoder CD4 is provided commonly for the memory cell blocks MA7 and MA8.

The sense amplifier groups SA1-SA8 are associated with the memory cell blocks MA1-MA8, respectively. The sense amplifier groups SA1-SA8 sense and amplify the information of the selected memory cells in the corresponding memory cell blocks. Each of the sense amplifier groups SA1-SA8 includes sense amplifiers which are respectively associated with bit line pairs in a corresponding memory cell block.

In order to drive the sense amplifier groups SA1-SA8, there is provided a $\overline{CAS}$ before $\overline{RAS}$ detecting circuit 30 for generating a refresh instruction detecting signal $\phi_{REF}$, a sense amplifier activating signal generating circuit 4 for generating sense amplifier activating signals $\phi 0$ and $\phi 1$ in response to an internal signal Int.RAS from a control signal generating circuit 5, and a sense trigger generating circuit 20 which generates sense trigger signals $\phi 1$-$\phi 8$ in response to the signals $\phi_{REF}$, $\phi 0$ and $\phi 1$.

Figure 1:
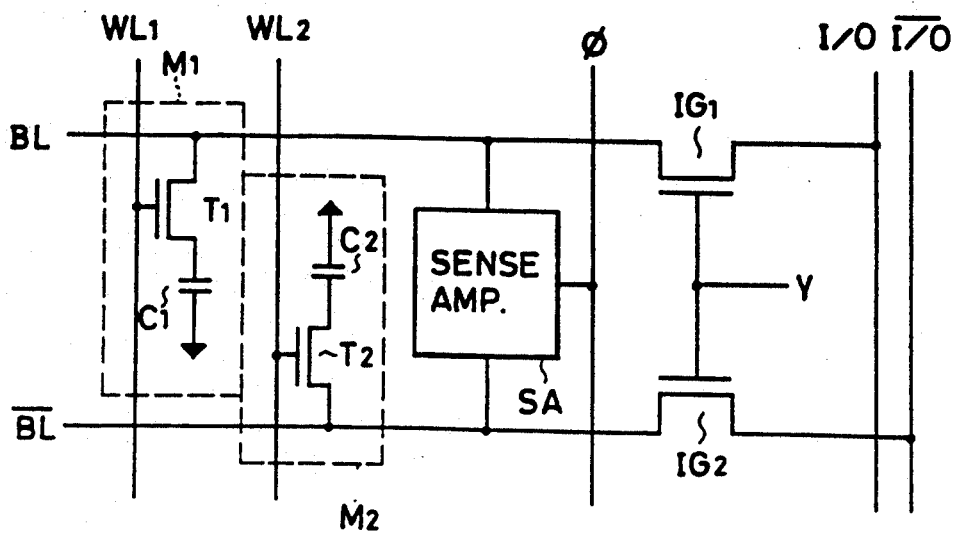
FIG. 1 schematically illustrates a circuit construction related to memory cells and a pair of bit lines in a dynamic type semiconductor memory device.
Figure 2:
FIG. 2 is a signal waveform diagram illustrating operations during a refresh of a $\overline{RAS}$ only refresh which is one of refresh modes.
Figure 2:
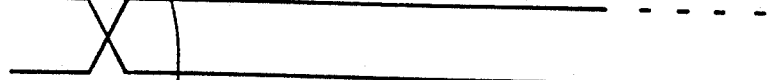
Figure 2:
Figure 2:
Figure 2:

The $\overline{CAS}$ before $\overline{RAS}$ detecting circuit 30 generates the refresh instruction detecting signals $\phi_{REF}$ in response to timing relationship of externally applied signals $\overline{RAS}$ and $\overline{CAS}$. The construction of the $\overline{CAS}$ before $\overline{RAS}$ detecting circuit 30 is similar to the circuit construction shown in FIG. 1, in which a signal formed by inversion of the refresh instruction signal $\overline{REF}$ corresponds to the refresh instruction detecting signal $\phi_{REF}$.

The sense amplifier activating signal generating circuit 4 activates either of the sense amplifier activating signal $\phi 0$ or $\phi 1$ at a timing of application of the internal signal Int.RAS in response to the highest order address signal bit RA8.

The sense trigger generating circuit 20 transmits sense trigger signals $\phi s1$-$\phi s8$ to the corresponding sense amplifier groups SA1-SA8, respectively. When the refresh instruction detecting signal $\phi_{REF}$ is active and the semiconductor memory device is in a normal operation state, the sense trigger generating circuit 20 simultaneously activates the sense amplifier groups associated with the four blocks in response to the sense amplifier activating signal $\phi 0$ or $\phi 1$. When the refresh instruction detecting signal $\phi_{REF}$ is active and the semiconductor memory device is detected to be in the refresh mode, the sense trigger generating circuit 20 sequentially activates, at different timings, the sense amplifier trigger signals corresponding to the memory cell blocks designated by the highest order row address signal bit RA8.

Figure 3:
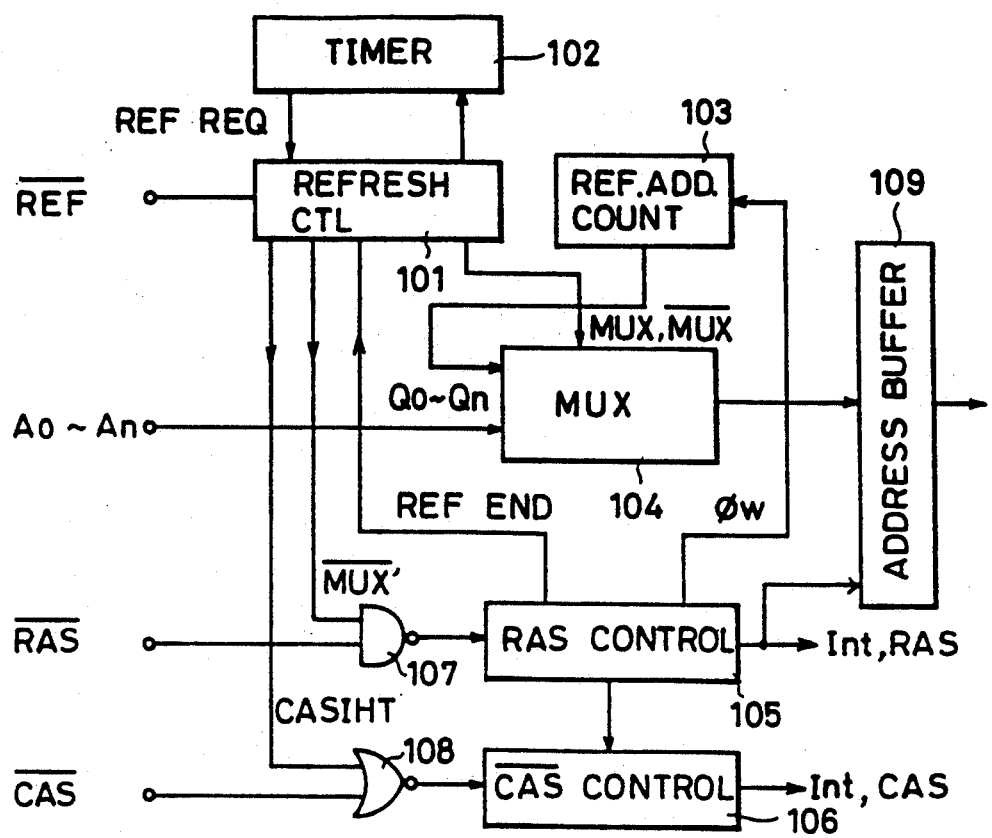
FIG. 3 represents a construction of a refresh circuit in a dynamic type semiconductor memory device containing a refresh function.
Figure 4:
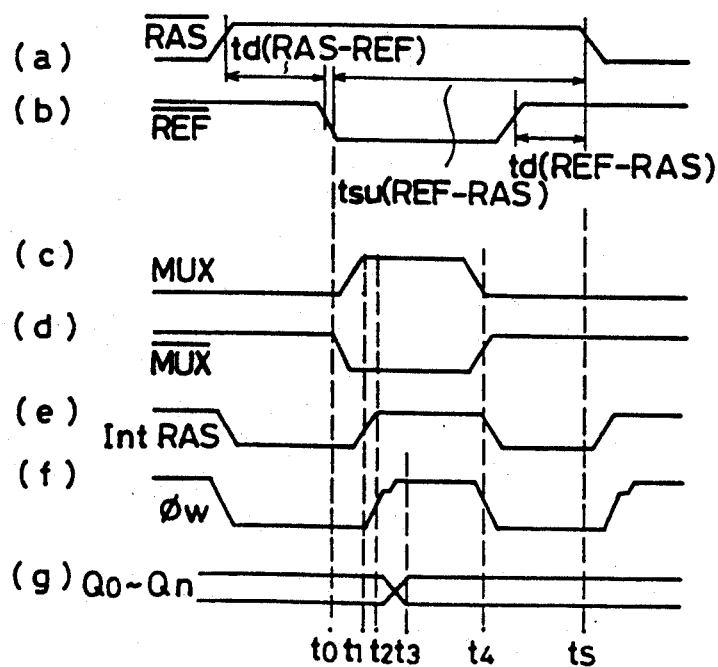
FIG. 4 is a signal waveform diagram illustrating operations in an auto-refresh of a refresh circuit shown in FIG. 3.
Figure 5:
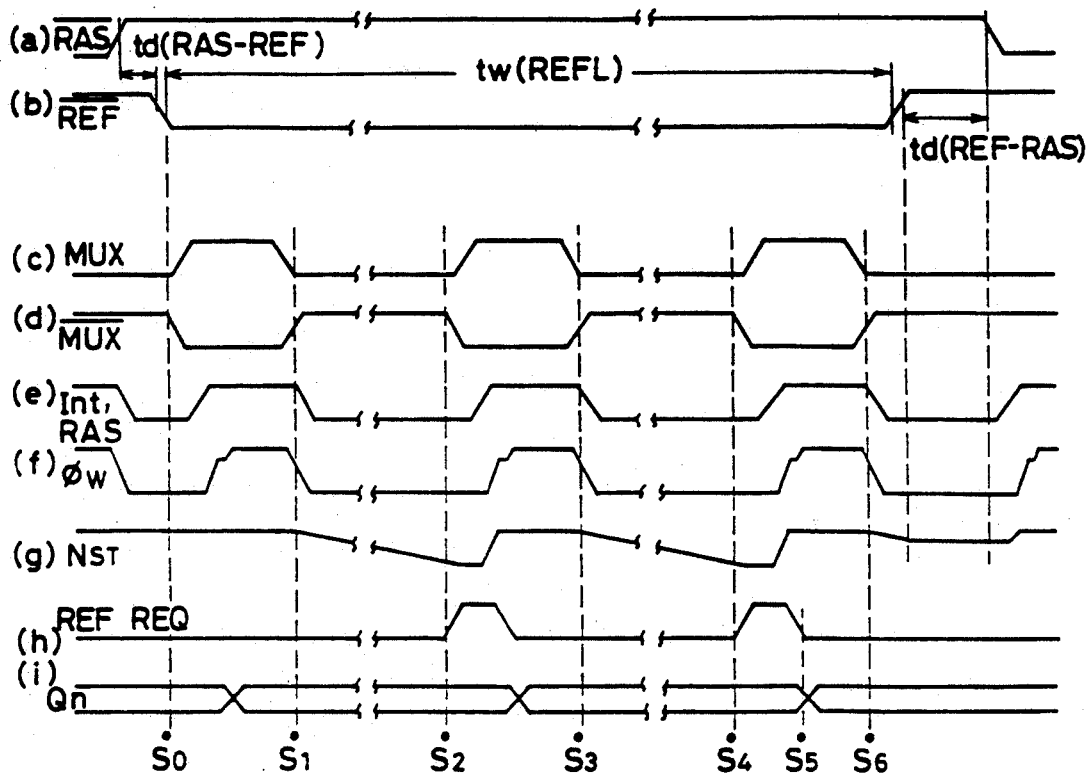
FIG. 5 is a signal waveform diagram illustrating operations in a self-refresh of a circuit shown in FIG. 3.
Figure 6:
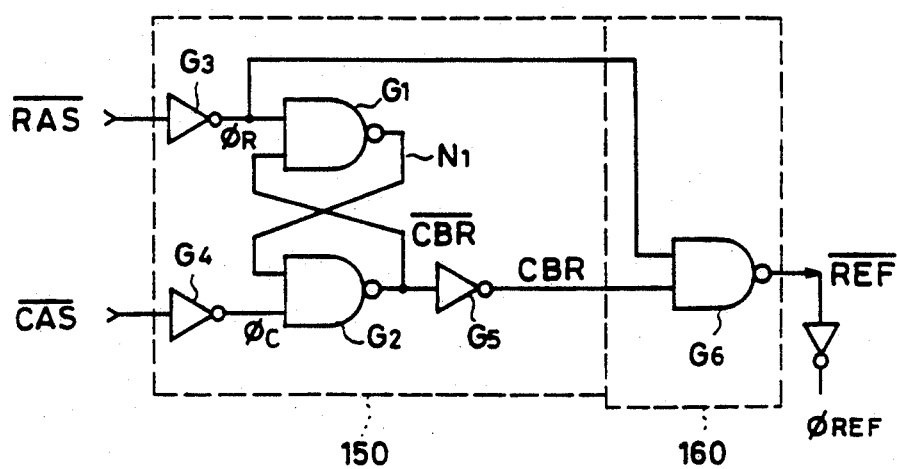
FIG. 6 represents a construction of a refresh instruction detecting signal generating circuit in a $\overline{CAS}$ before $\overline{RAS}$ refresh cycle.
Figure 7:
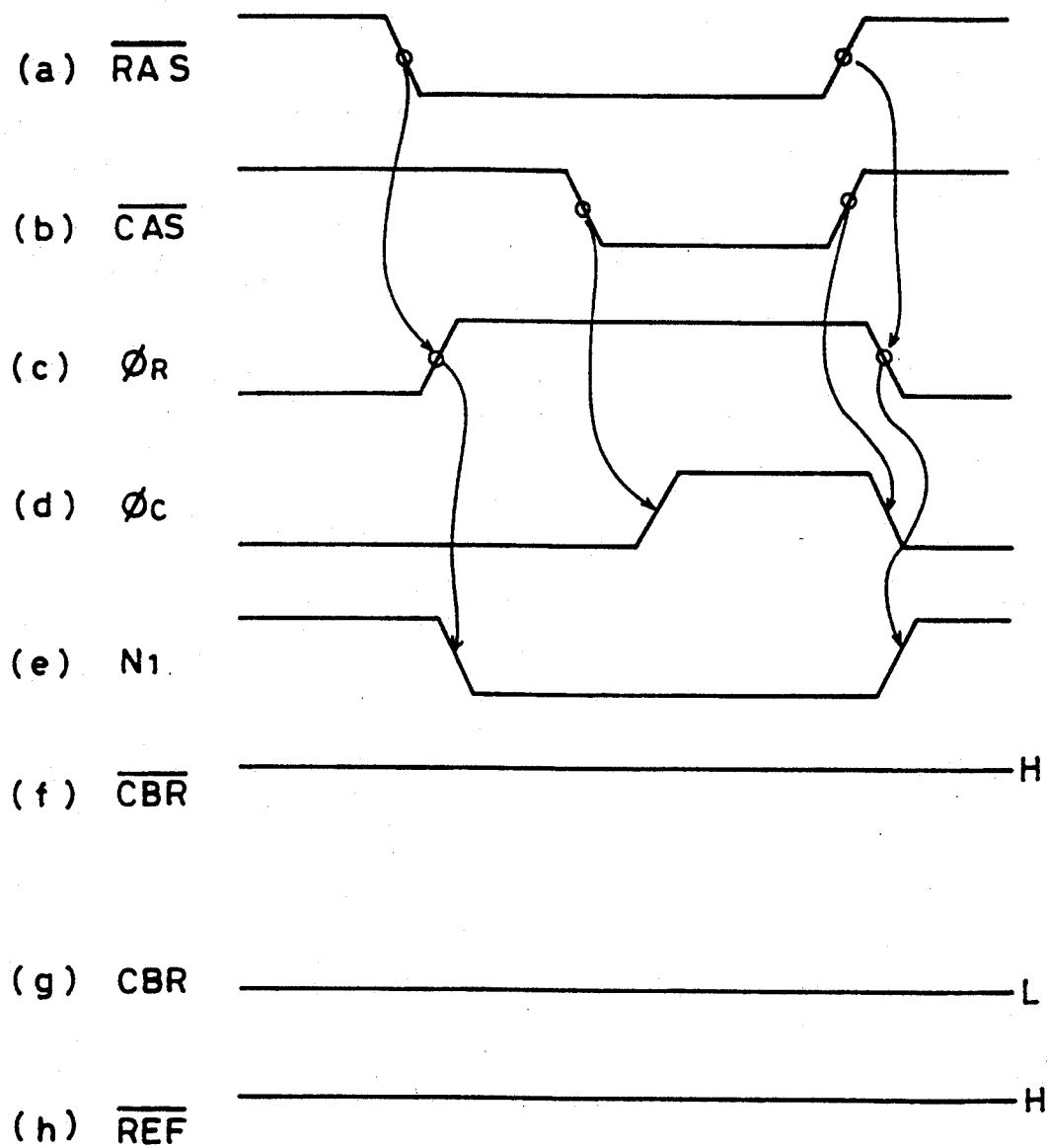
FIGS. 7 and 8 are signal waveform diagrams illustrating operations of a circuit shown in FIG. 6.
Figure 8:
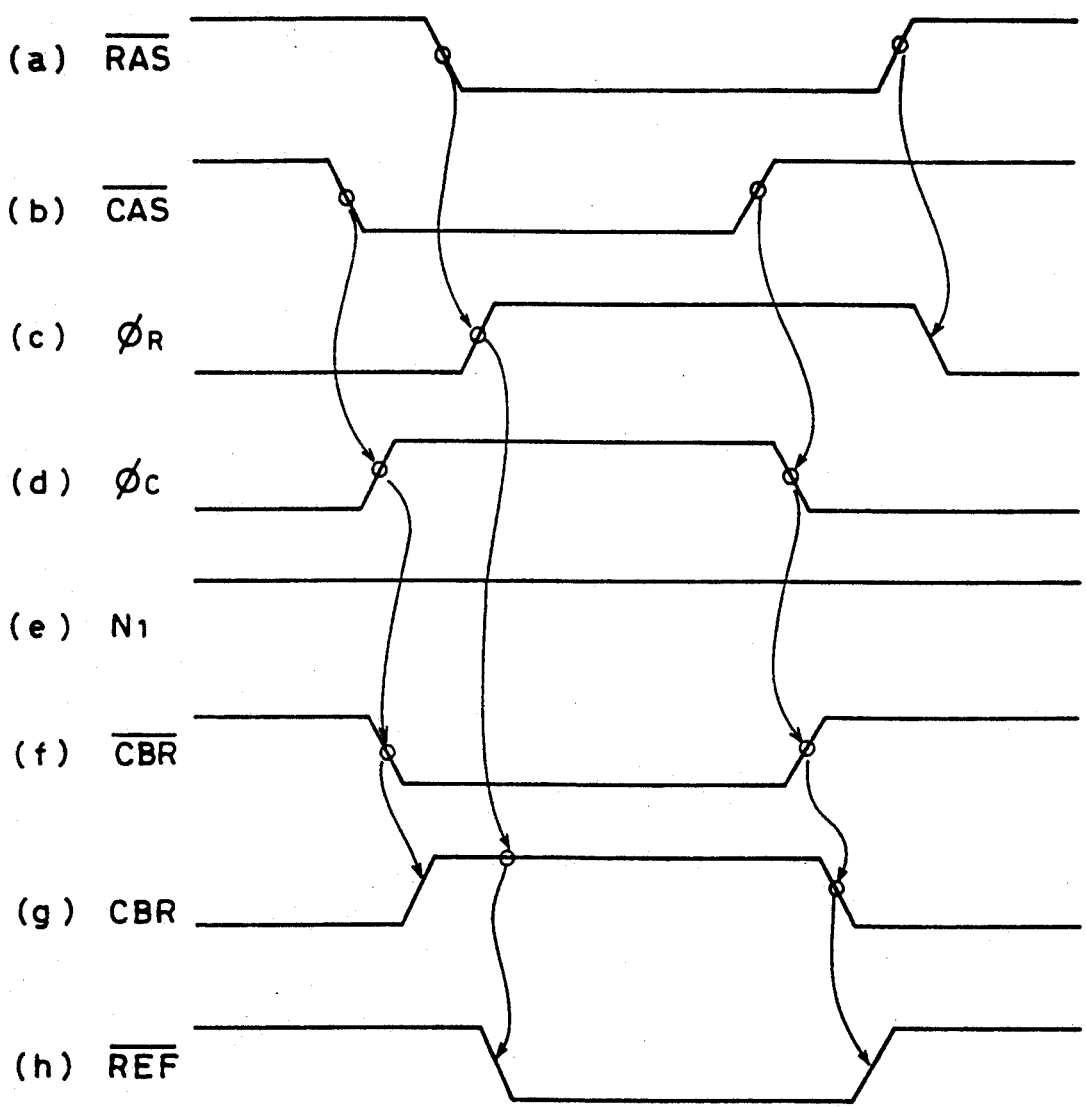
Figure 9:
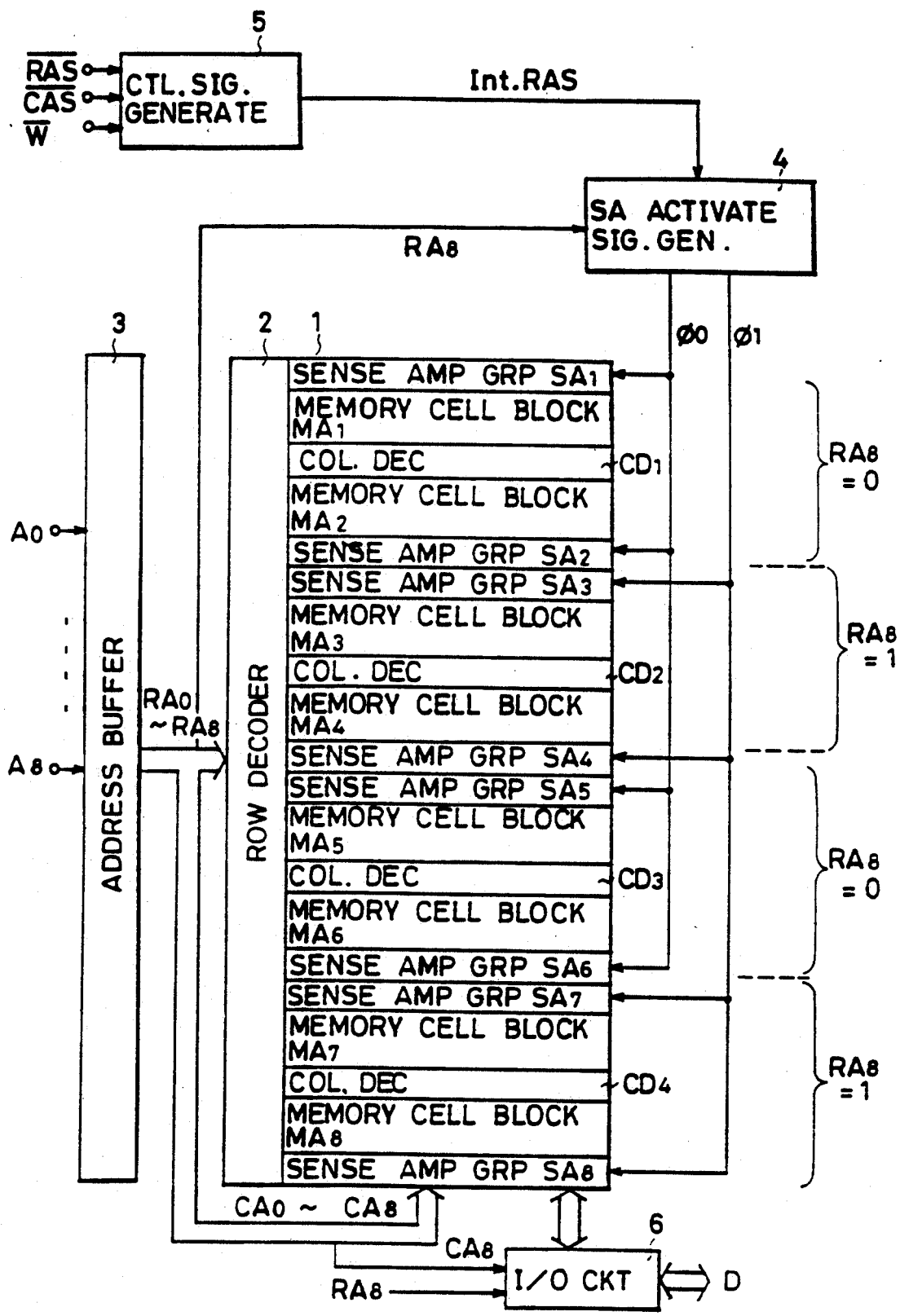
FIG. 9 schematically illustrates a whole construction of a dynamic type semiconductor memory device.
Figure 10:
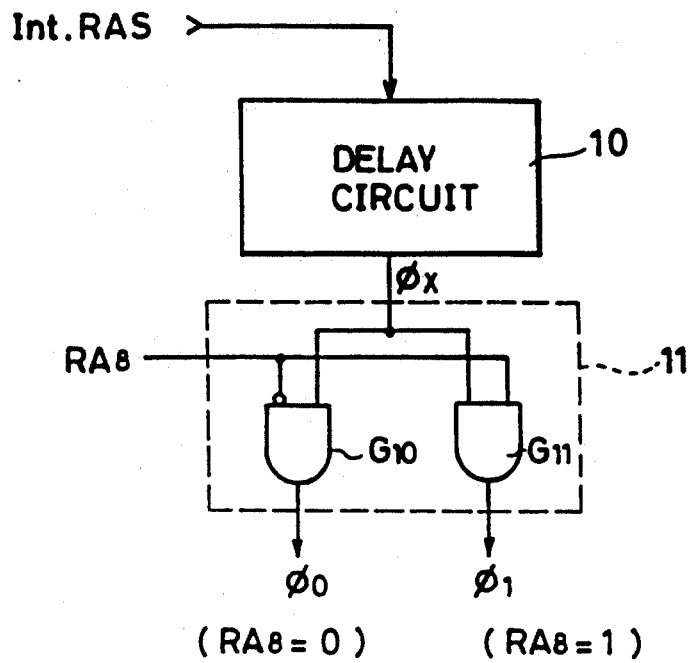
FIG. 10 represents a specific construction of a sense amplifier activating signal generating circuit shown in FIG. 9.
Figure 11:
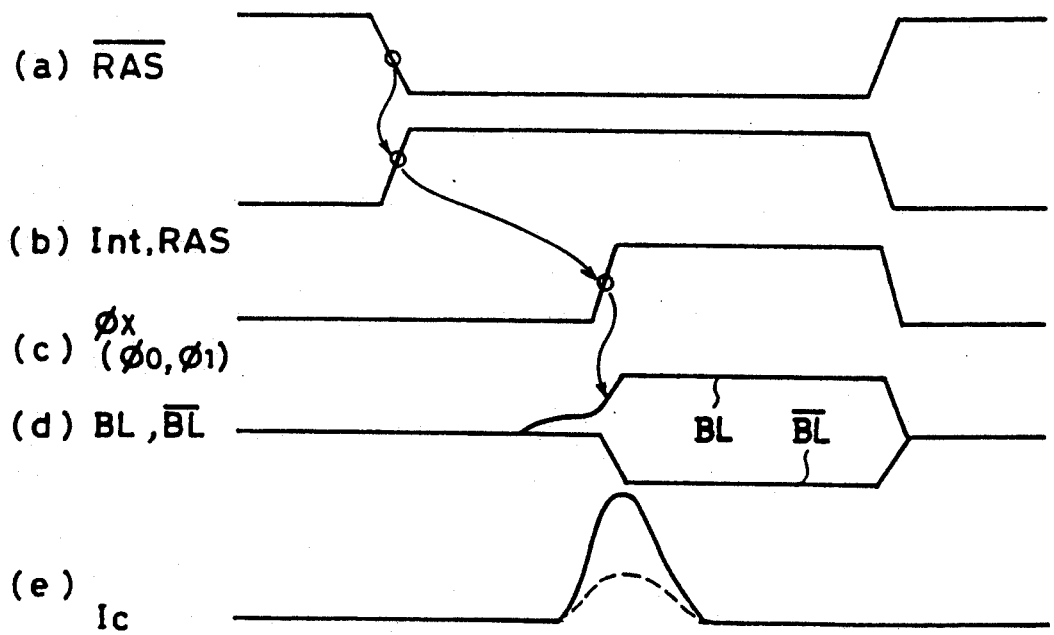
FIG. 11 is a signal waveform diagram for a sensing operation in a conventional dynamic type semiconductor memory device.
Figure 12:
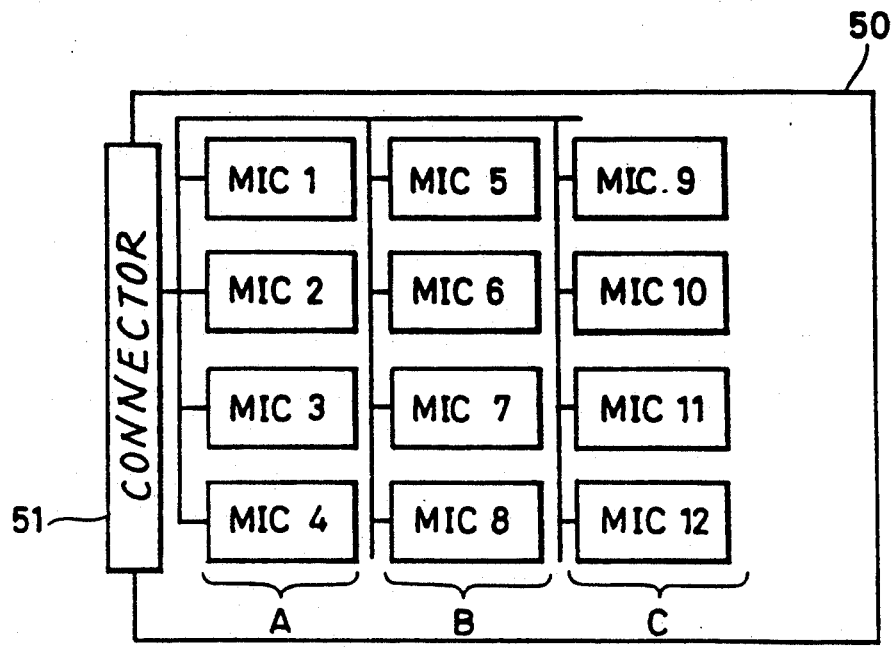
FIG. 12 represents a construction of a memory system.
Figure 13:
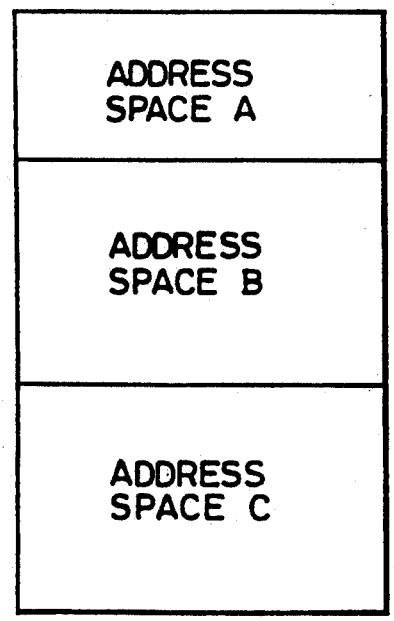
FIG. 13 illustrates a correspondence between respective semiconductor memory devices of a memory system shown in FIG. 12 and address spaces.

The semiconductor memory device also includes, as peripheral circuitry, a refresh circuit 50 which is activated in response to the refresh instruction detecting signal $\phi_{REF}$ and generates various signals necessary for the refresh, and a multiplexer 52 responsive to a switch signal MUX from the refresh circuit 50 for selectively allowing passage of the external address signals A0-A8 or the passage of the refresh address signals Q0-Q8 from the refresh circuit 50. The refresh circuit 50 includes a refresh address counter 51 which increments its content by one bit when a word line is selected during the refresh. The refresh address counter 51 performs counting in response to a word line drive signal $\phi w$. The construction of the refresh circuit 50 is substantially similar to that of the refresh circuit shown in FIG. 3.

In the normal mode of the semiconductor memory device, the I/O circuit 6 operates to select one bit among the data of four bits which are simultaneously selected (in a case of a semiconductor memory device having a ×1 bit construction) and to transfer the data between the external of the device and the selected memory cell in either direction. The I/O circuit 6 performs this four-to-one selection in accordance with the highest order address signal bits RA8 and CA8.

Figure 15:
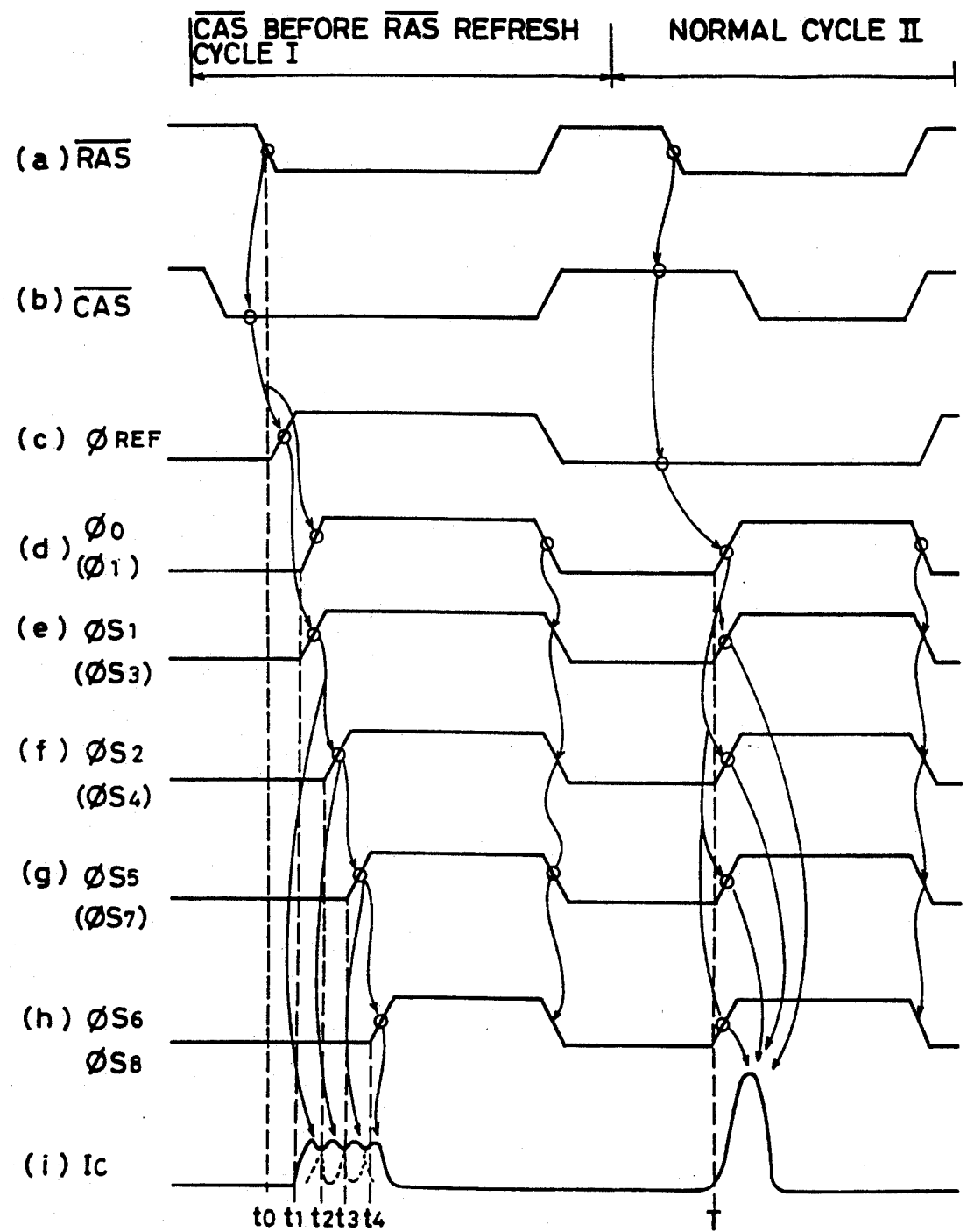
FIG. 15 is a signal waveform diagram illustrating operations during activation of sense amplifiers in a dynamic type semiconductor memory device of the invention.

FIG. 15 is a signal waveform diagram illustrating operations of the dynamic type semiconductor memory device shown in FIG. 14. Operations of the dynamic type semiconductor memory device of an embodiment of the invention will be described with reference to FIGS. 14 and 15. First, the operations in the refresh cycle will be described.

In the dynamic type semiconductor memory device, the instruction for the refresh is set by a timing relationship between the signal $\overline{RAS}$ and the signal $\overline{CAS}$. Specifically, the refresh cycle is set by the condition that the signal $\overline{CAS}$ is already lowered to "L" at a time t1 of falling of the signal $\overline{RAS}$. The $\overline{CAS}$ before $\overline{RAS}$ detecting circuit 30 determines that the refresh instruction is applied, based on the timing relationship between the signals $\overline{RAS}$ and $\overline{CAS}$, and raises the refresh instruction detecting signal $\phi_{REF}$ to the active state, i.e., "H" to apply it to the sense trigger generating circuit 20.

The control signal generating circuit 5 generates the internal signal Int.RAS in response to the falling of this external signal $\overline{RAS}$ and applies it to the sense amplifier activating signal generating circuit 4. The refresh circuit 50 responds to the refresh instruction detecting signal $\phi_{REF}$ from the $\overline{CAS}$ before $\overline{RAS}$ detecting circuit 30 to generate the switch signal MUX for applying it to the multiplexer 52. The multiplexer 52 selects the refresh address Q0–Q8 from the refresh address counter 51 included in this refresh circuit 50 and applies it to the address buffer 3. The address buffer 3 responds to the rising of the internal signal Int.RAS for latching the applied signals and generating the internal row address signals RA0–RA8 to be applied to the row decoder 2. The row decoder 2 decodes thus applied row address signals RA0–RA8 and selects one word line in each of four memory cell blocks among the eight memory cell blocks MA1–MA8.

After the data in the memory cells connected to the selected word lines is transmitted to the related bit lines, the sense amplifier activating signal generating circuit 4 generates the sense amplifier activating signal $\phi 0$ or $\phi 1$. Selection of the sense amplifier activating signal $\phi 0$ or $\phi 1$ is made by "0" or "1" of the internal row address signal bit RA8 from the address buffer 3. If the address signal bit RA8 is "0", the sense amplifier activating signal $\phi 0$ is generated, and if it is "1", the sense amplifier activating signal $\phi 1$ is generated.

The sense trigger generating circuit 20 responds to the refresh instruction detecting signal $\phi_{REF}$ for sequentially delaying the applied sense amplifier activating signals $\phi 0$ ($\phi 1$) by predetermined periods of time and applying them as the sense trigger signals $\phi s1$–$\phi s8$. The sense amplifier groups corresponding to the respective selected memory cell blocks perform the sensing operations in response to the sense trigger signals $\phi s1$–$\phi s8$. Specifically, when the sense amplifier activating signal $\phi 0$ is generated at a time t1, the sense trigger signal $\phi s1$ ($\phi s3$) is generated in response thereto. Then, the sense trigger signal $\phi s2$ ($\phi s4$) is generated at a time t2, the sense trigger signal $\phi s5$ ($\phi s7$) is generated at a time t3, and the sense trigger signal $\phi s6$ ($\phi s8$) is generated at a time t4. The sense amplifiers included in each sense amplifier group perform the sense operations in response to the related sense trigger signals for charging and discharging the related bit lines. Therefore, the peak current Ic can be small in this refresh mode, as shown in FIG. 15(i), because the charge and discharge current is dispersed.

Then, operations in the normal cycle for the normal reading and writing of the data will be described below. In the normal cycle, the signal $\overline{RAS}$ falls to "L" prior to the falling of the signal $\overline{CAS}$ to "L". Based on the timing relationship between the signals $\overline{RAS}$ and $\overline{CAS}$, the $\overline{CAS}$ before $\overline{RAS}$ detecting circuit 30 determines that the refresh instruction is not applied, and maintains the refresh instruction detecting signal $\phi_{REF}$ at the inactive state of "L".

Since the refresh circuit 50 is not activated, the multiplexer circuit 52 selects externally applied address signals A0–A8 in response to the switch signal MUX from the refresh circuit 50 and applies them to the address buffer 3. The address buffer 3 responds to the falling of the external signal $\overline{RAS}$, i.e., rising of the internal signal Int.RAS, for latching the applied address signals and generating the internal row address signals RA0–RA8. Similarly to the refresh cycle, the sense amplifier activating signal generating circuit 4 generates the sense amplifier activating signal $\phi 0$ or $\phi 1$ in response to the internal signal Int.RAS from the control signal generating circuit 5.

Since the refresh instruction detecting signal $\phi_{REF}$ is "L", the sense trigger generating circuit 20 responds to the sense amplifier activating signal $\phi 0$ or $\phi 1$ for applying the sense trigger signals to the sense amplifier groups corresponding to the memory cell blocks designated by the row address signal bit RA8. In this time, the sense amplifier groups associated with the four memory cell blocks are simultaneously activated to perform the sense operation at a time T, so that the peak current Ic is larger than that in the refresh cycle.

After the completion of this sense operation, the column decoders CD1–CD4 select four columns in response to the subsequent falling of the signal $\overline{CAS}$, and the read or write of the data is performed through the I/O circuit 6.

In the construction described above, each bit line in the unselected memory cell blocks is maintained at a precharged state.

Figure 16:
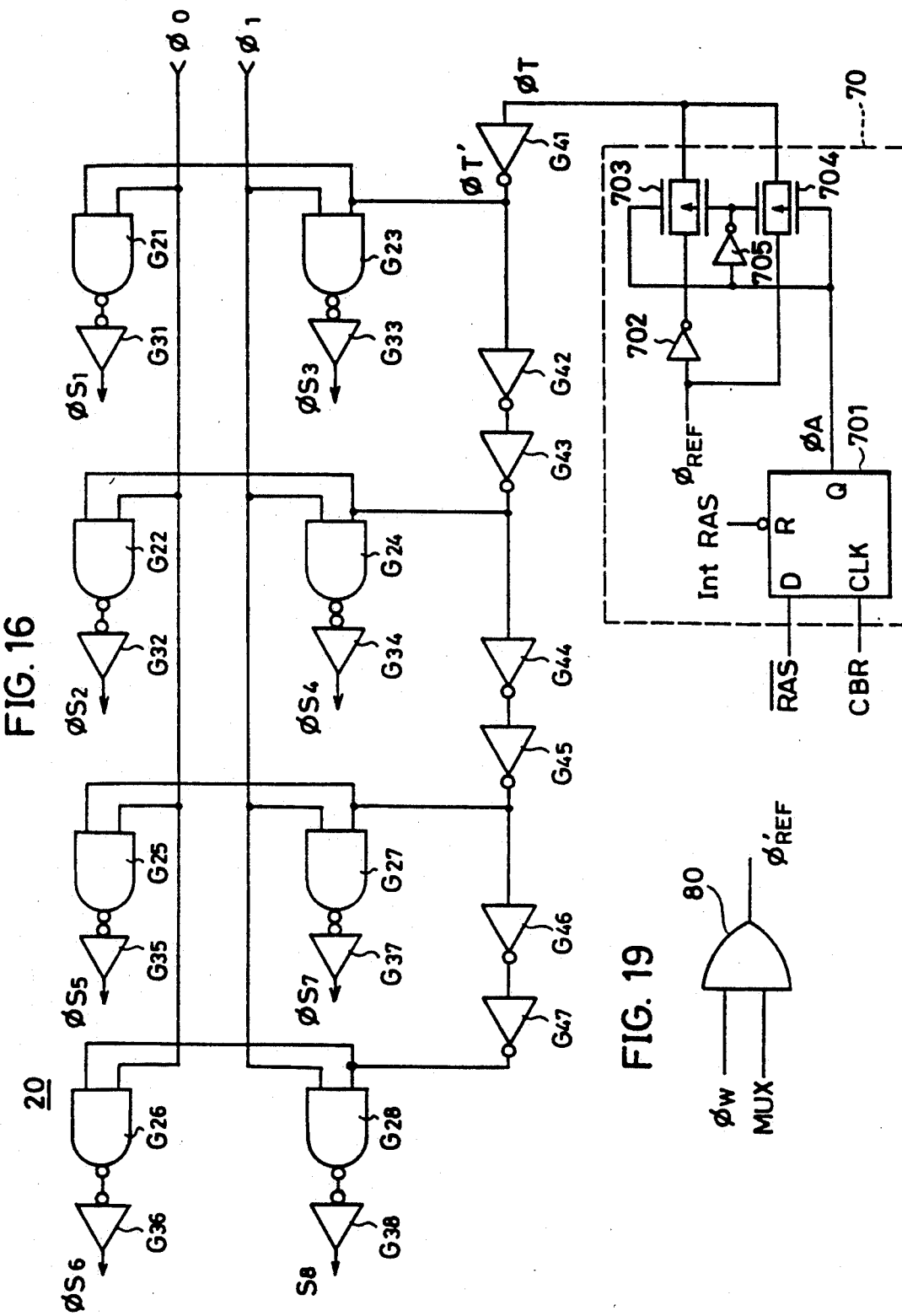
FIG. 16 represents a specific construction of a sense trigger generating circuit shown in FIG. 14.

FIG. 16 represents a specific construction of a sense trigger generating circuit shown in FIG. 14. In FIG. 16, the sense trigger generating circuit 20 in FIG. 16 includes inverters G41–G47 for delaying the respective refresh instruction detecting signals $\phi_{REF}$, NAND gates G21–G28 for generating the sense trigger signals $\phi s1$–$\phi s8$ and inverters G31–G38.

The NAND gate G21 receives the sense amplifier activating signal $\phi 0$ and an output of the inverter G41. The inverter G31 receives an output of the NAND gate G21 and generates the sense trigger signal $\phi s1$.

The NAND gate G22 receives the sense amplifier activating signal $\phi 0$ and an output of the inverter G43. The inverter G32 receives an output of the NAND gate G22 and generates the sense trigger signal $\phi s2$.

The NAND gate G25 receives the sense amplifier activating signal $\phi 0$ and an output of the inverter G45.

The inverter G35 receives an output of the NAND gate G25 and generates the sense trigger signal $\phi s5$.

The NAND gate G26 receives the sense amplifier activating signal $\phi 0$ and an output of the inverter G47. The inverter G36 receives an output of the NAND gate G26 and generates the sense trigger signal $\phi s6$.

The NAND gate G23 receives the sense amplifier activating signal $\phi 1$ and an output of the inverter G41. The inverter G33 receives an output of the NAND gate G23 and generates the sense trigger signal $\phi s3$.

The NAND gate G24 receives the output of the inverter G43 and the sense amplifier activating signal $\phi 1$. The inverter G34 receives an output of the NAND gate G24 and generates the sense trigger signal $\phi s4$.

The NAND gate G27 receives the output of the inverter G45 and the sense amplifier activating signal $\phi 1$. The inverter G37 receives an output of the NAND gate G27 and generates the sense trigger signal $\phi s7$.

The NAND gate G28 receives the output of the inverter G47 and the sense amplifier activating signal $\phi 1$. The inverter G38 receives an output of the NAND gate G28 and generates the sense trigger signal $\phi s8$.

In order to make different the generation timings of the sense amplifier trigger signals $\phi s1$–$\phi s8$ between the refresh mode and the normal mode, there is provided a timing signal generating circuit 70.

The timing signal generating circuit 70 includes a D-flip-flop 701, CMOS transmission gates 703 and 704, and inverters 702 and 705. The D-flip-flop 701 has a D input for receiving the external signal $\overline{RAS}$, a clock input CLK for receiving a $\overline{CAS}$ before $\overline{RAS}$ detecting signal CBR, a Q output for generating a switch signal $\phi A$ and a reset input R. The reset input R is operable to reset an output Q to "L" in response to falling of the internal signal Int.RAS.

The CMOS transmission gate 703 receives the refresh instruction detecting signal $\phi_{REF}$ through the inverter 702. The CMOS transmission gate 704 directly receives the refresh instruction detecting signal $\phi_{REF}$. The transmission gates 703 and 704 receive at their control inputs the switch control signal $\phi A$ from the D-flip-flop 701 and the signal supplied through the inverter 705, respectively. The CMOS transmission gates 703 and 704 complementally operate to generate the control signal $\phi T$ in accordance with the conduction states thereof.

NAND gate generates the signal "L" when all the applied inputs are "H". An inverter inverts an applied signal to output it. The D-flip-flop 701 becomes a latch state to latch the signal applied to its D input, in response to the rising of the signal applied to the clock input CLK, and to output the latched signal from the Q output. Now, the operations will be described with reference to FIGS. 17 and 18 which are operation waveform diagrams thereof.

Figure 17:
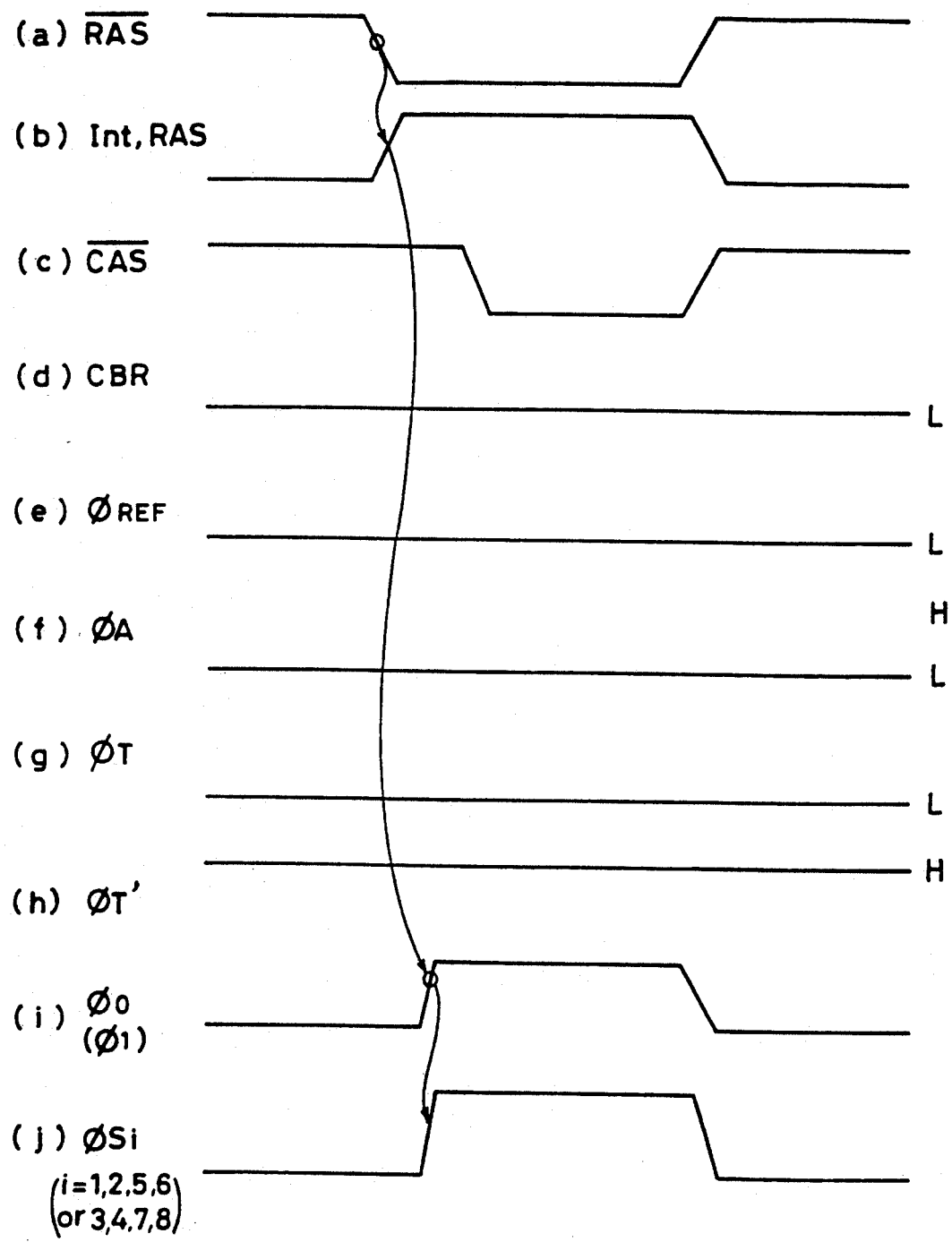
FIGS. 17 and 18 are signal waveform diagrams illustrating operations of a sense trigger generating circuit shown in FIG. 16.

First, the sense operation in the normal operation will be described with reference to FIG. 17. In the normal operation, the signal $\overline{RAS}$ falls prior to the falling of the signal $\overline{CAS}$. Therefore, the $\overline{CAS}$ before $\overline{RAS}$ detecting signal CBR is not generated in this case, so that the D-flip-flop 701 maintains its reset state, and the signal $\phi A$ from its Q output is "L". The transmission gate 704 is conductive, and the refresh instruction detecting signal $\phi_{REF}$ is applied to the inverter G41 as the control signal $\phi T$. In this normal operation, the refresh instruction detecting signal $\phi_{REF}$ is not generated and is fixed to "L", so that the control signal $\phi T$ is fixed at the "L" level and the output $\phi T$, of the inverter G41 is fixed at the "H" level.

After the word line selecting operation is subsequently performed in each memory cell block in accordance with the falling of the signal $\overline{RAS}$, the sense amplifier activating signal $\phi 0$ (or $\phi 1$) is generated. The NAND gates G21–G28 each have already received at one input the signals of "H". Therefore, in response to the generated sense amplifier activating signal $\phi 0$ (or $\phi 1$), the sense trigger signals $\phi s1$, $\phi s2$, $\phi s5$ and $\phi s6$ (or $\phi s3$, $\phi s4$, $\phi s7$ and $\phi s8$) are simultaneously raised.

Figure 18:
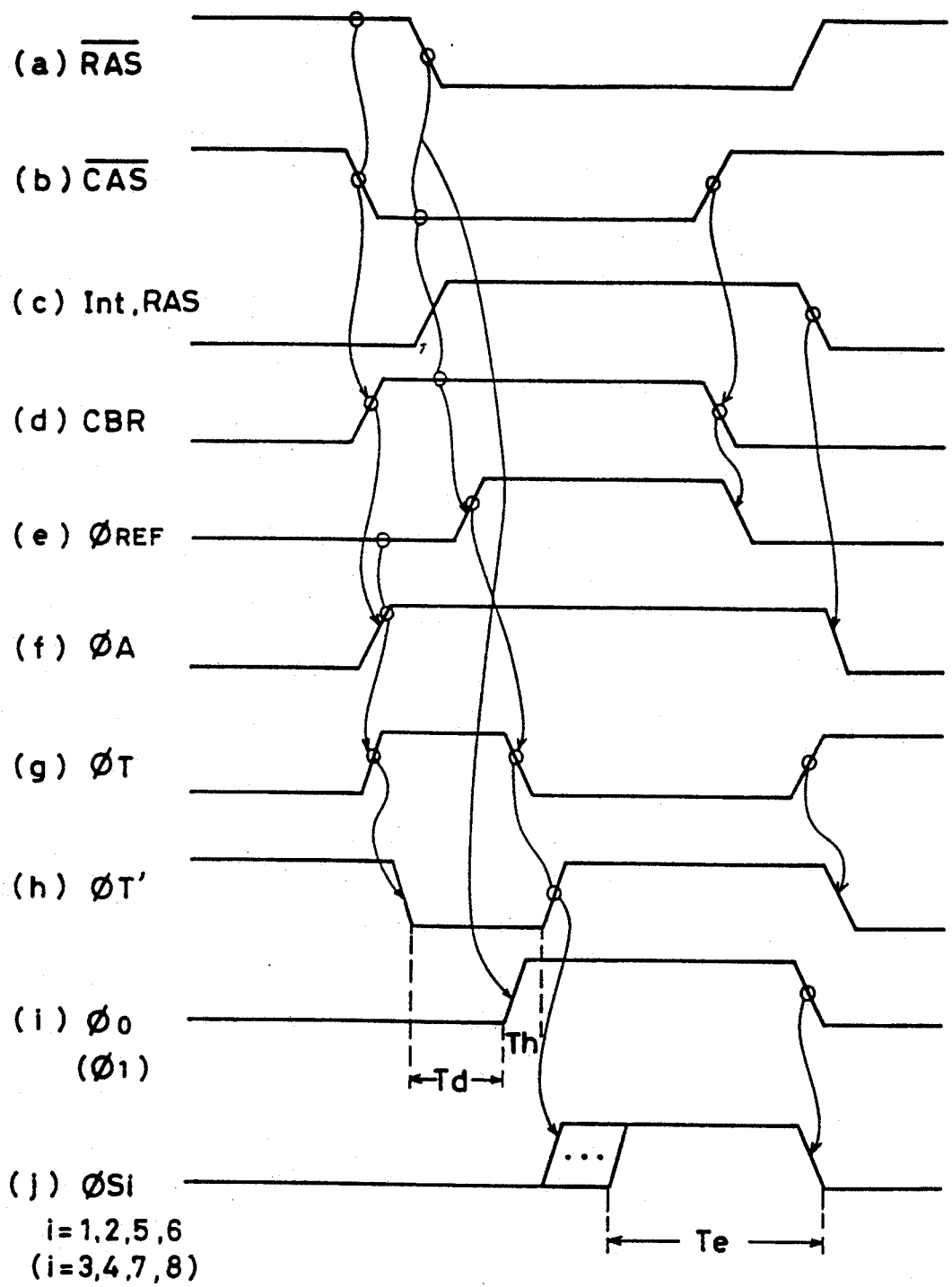

Referring to FIG. 18, the operation in the refresh cycle will be described. The refresh cycle is set by falling the signal $\overline{CAS}$ to "L" prior to the falling of the $\overline{RAS}$. In response to the falling of the signal $\overline{CAS}$, the $\overline{CAS}$ before $\overline{RAS}$ detecting signal CBR is generated. At the time of generation of this signal CBR, the signal $\overline{RAS}$ is still "H", so that the signal $\phi A$ from the Q output of the D-flip-flop 701 rises to "H". Thereby, the CMOS transmission gate 703 becomes conductive. In this time, the refresh instruction detecting signal $\phi_{REF}$ is not yet generated, so that the output of the inverter 702 is "H", and thus the control signals $\phi T$ and $\phi T$, are "H" and "L", respectively. Therefore, the outputs of the NAND gates G21–G28 are "H" in this condition, and all the sense trigger signals $\phi s1$–$\phi s8$ are still "L".

Then, the sense amplifier activating signal $\phi 0$ (or $\phi 1$) is generated after the falling of the signal $\overline{RAS}$ followed by the latching of the refresh address and the selection of the word lines. The inverter G41 has a predetermined delay time and outputs the signal $\phi T'$ formed by delaying the control signal $\phi T$ by the predetermined time and by inverting it. By appropriately setting the delay times provided by the inverter 702 and the inverter G41, the control signal $\phi T'$ can be changed from "L" to "H" after the refresh instruction detecting signal $\phi_{REF}$ rises to "H" and the sense amplifier activating signal $\phi 0$ (or $\phi 1$) is generated, i.e., after elapsing of a time Th. In response to the rising of this signal $\phi T'$ to "H", the sense trigger signal $\phi s1$ (or $\phi s3$) is initially generated by the gates at the first stage, and thus the sense operation is performed in the corresponding memory cell block MA1 (or MA3). Then, the sense trigger signal $\phi s2$ (or $\phi s4$) is generated after the elapsing of the delay times provided by the inverters G42 and G43, and subsequently the sense trigger signal $\phi s5$ (or $\phi s7$) is generated after the delay determined by the inverters G44 and G45. Further, the sense trigger signal $\phi s6$ (or $\phi s8$) is generated after the delay determined by the inverters G46 and G47. Therefore, in this refresh cycle, there are provided four kinds of the sense amplifier start timings.

With respect to a period of time Td which is required between the lowering of the control signal $\phi T'$ to "L" and the subsequent rising of the sense amplifier activating signal $\phi 0$ (or $\phi 1$), it is necessary to appropriately set the pulse width of the control signal, i.e., a period of time between the generation of the $\overline{CAS}$ before $\overline{RAS}$ detecting signal CBR after the falling of the signal $\overline{CAS}$, and the generation of the refresh instruction detecting signal $\phi_{REF}$. This requirement can be satisfied by appropriately setting a value of the delay time provided by the inverter G41.

Further, the minimum period of time Te among the periods for which the sense trigger signals are activated in this refresh cycle is shorter than the period for maintaining the sense amplifier active in the normal cycle. However, since neither writing nor reading of the data is performed in this refresh operation, it is only required to ensurely acquire a period of time enough only for the writing in the memory cells of the data sensed and amplified by the sense amplifiers.

In the above embodiment, the refresh instruction detecting signal is introduced by the $\overline{CAS}$ before $\overline{RAS}$ detecting circuit. However, in such a case that this dynamic type semiconductor memory device has the auto-refresh or self-refresh function for performing the refresh operation in response to the externally applied refresh instruction signal $\overline{REF}$, a circuit shown in FIG. 19 may be employed for generating the refresh instruction detecting signal.

Figure 19:
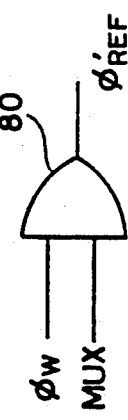
FIG. 19 represents a construction of a refresh instruction detecting signal generating circuit.

FIG. 19 illustrates a construction of a generating circuit of a refresh instruction detecting circuit of another embodiment of the invention. This construction includes a gate circuit 80 which receives at its one input the signal MUX generated upon refresh instruction and receives at its other input the internal signal $\phi w$. The refresh instruction detecting signal $\phi_{REF}'$ is generated from this gate circuit 80. This signal $\phi_{REF}'$ is applied to the sense trigger generating circuit 30. The signals MUX and $\phi w$ shown in FIG. 19 are signals generated in the refresh circuit shown in FIG. 3. The flip-flop 701 receives at its clock input CLK the signal MUX.

Figure 20:
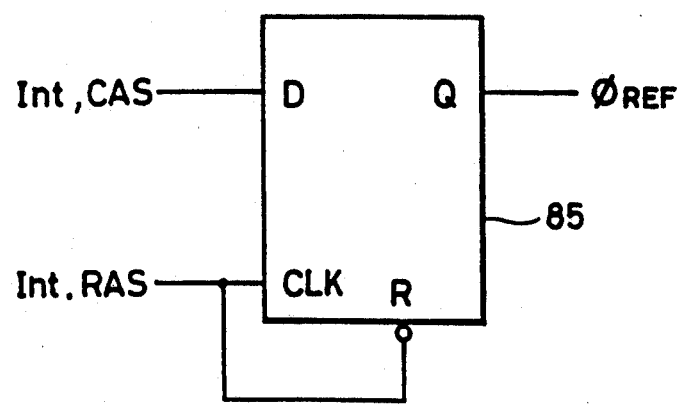
FIG. 20 represents another construction of a refresh instruction detecting signal generating circuit.
Figure 21:
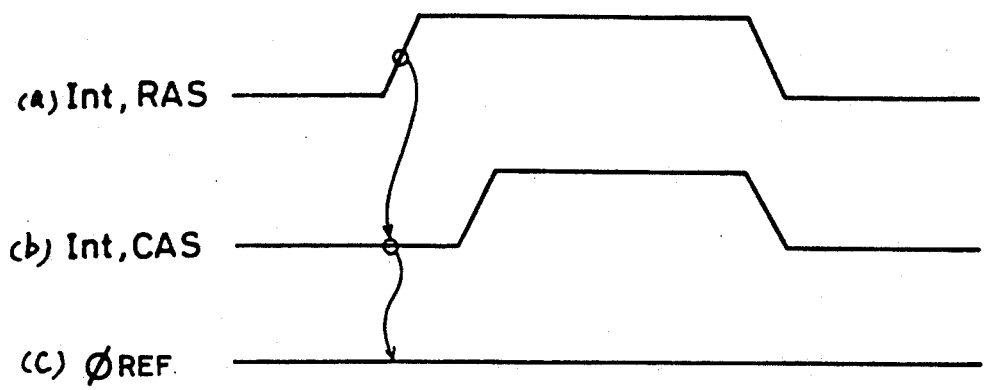
FIGS. 21 and 22 are signal waveform diagrams illustrating operations of a circuit shown in FIG. 20.
Figure 22:
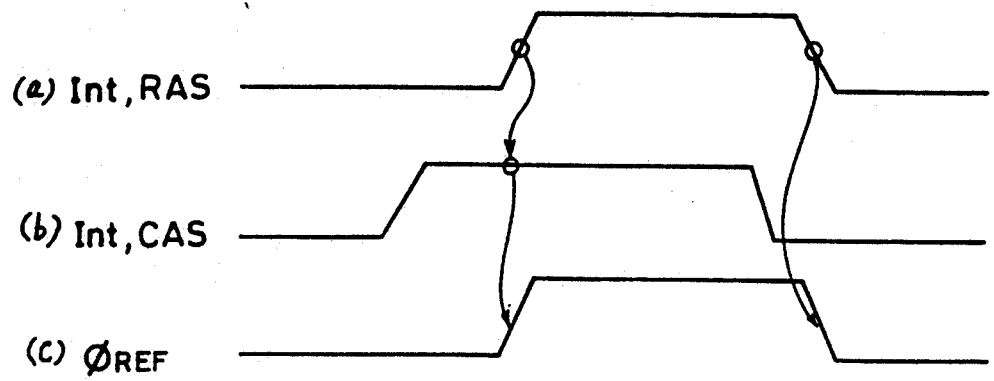

In the above embodiment, the flip-flop circuit including the NAND gate is used as the $\overline{CAS}$ before $\overline{RAS}$ detecting circuit for generating the refresh instruction detecting signal $\phi_{REF}$. However, the refresh instruction detecting signal $\phi_{REF}$ may be generated by a D-flip-flop 85, as shown in FIG. 20. In FIG. 20, D-flip-flop 85 has a D input for receiving the internal signal Int.CAS, a clock input CLK for receiving the internal signal Int.RAS, a Q output for generating the refresh instruction detecting signal $\phi_{REF}$ and a reset input R for receiving the internal control signal Int.RAS. The reset input R is adapted to reset this D-flip-flop 85 in response to the falling of the applied signal thereto, to set the signal potential of its Q output at "L". Then, the operation of the D-flip-flop shown in FIG. 20 will be described with reference to FIGS. 21 and 22 which are operation waveform diagrams of the circuit of FIG. 20. First, the operation in the normal operation cycle will be described with reference to FIG. 21.

In the normal operation cycle, the internal signal Int.RAS rises prior to the rising of the signal Int.CAS. The D-flip-flop 85 latches the signal applied to its D input in response to the rising of the signals applied to the clock input CLK, and maintainingly outputs it from its Q output regardless of its input state. Therefore, the signals $\phi_{REF}$ fixed at "L" are generated at its Q output in this case. Then, the operations in the refresh cycle will be described with reference to FIG. 22.

In the refresh cycle, the internal signal Int.CAS rises earlier than the internal signal Int.RAS. Therefore, the Q output of the D-flip-flop 85 rises to "H" in response to the rising of the signal Int.RAS, and generates a signal of which potential lowers to "L" in response to the falling of the internal signal Int.RAS. Thereby, the refresh instruction detecting signal $\phi_{REF}$ which is active while the signal Int.RAS is "H" can be generated.

Figure 23:
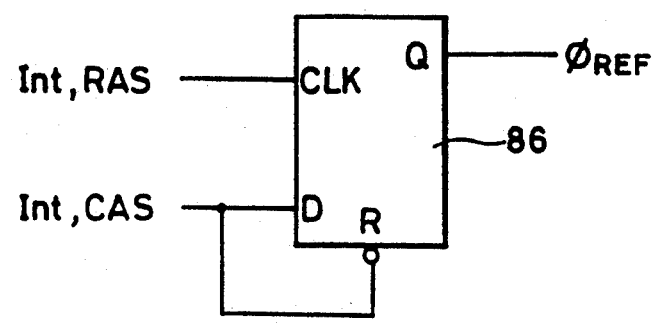
FIG. 23 illustrates still another construction of a refresh instruction detecting signal generating circuit.

FIG. 23 illustrates a construction of a refresh instruction detecting signal generating circuit of still another embodiment of the invention. In the construction shown in FIG. 23, a D-flip-flop 86 has the same construction as the D-flip-flop 85 shown in FIG. 20 except for a structure in which the internal signal Int.CAS is received at its reset input R.

Figure 24:
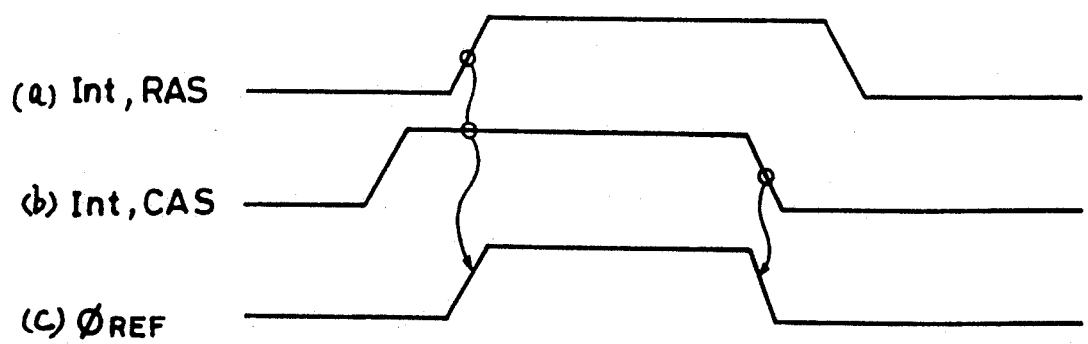
FIG. 24 is a signal waveform diagram illustrating operations of a circuit shown in FIG. 23.

Therefore, in the circuit construction shown in FIG. 23, the refresh instruction detecting signal $\phi_{REF}$ lowers to "L" in response to the falling of the internal signal Int.CAS as can be seen in a waveform diagram in the refresh cycle shown in FIG. 24.

The timings for generating the sense trigger signals in the sense trigger generating circuit shown in FIG. 16 are provided by the delay circuit formed of the inverters. However, the construction for this purpose is not restricted to that of provision of the delay by means of the inverters coupled in tandem, and may be formed of a circuit such as a counter circuit for generating the sense trigger signals $\phi s1-\phi s8$ at predetermined time intervals, which also provides similar advantages.

In the above embodiments, the sense trigger signals are generated in the refresh cycle, using the sense amplifier activating signals $\phi 0$ and $\phi 1$ which are generated at the timings similar to those in the normal cycle. Alternatively, the highest order bit RA8 of the refresh address may be used to generate the sense trigger signals.

Figure 25:
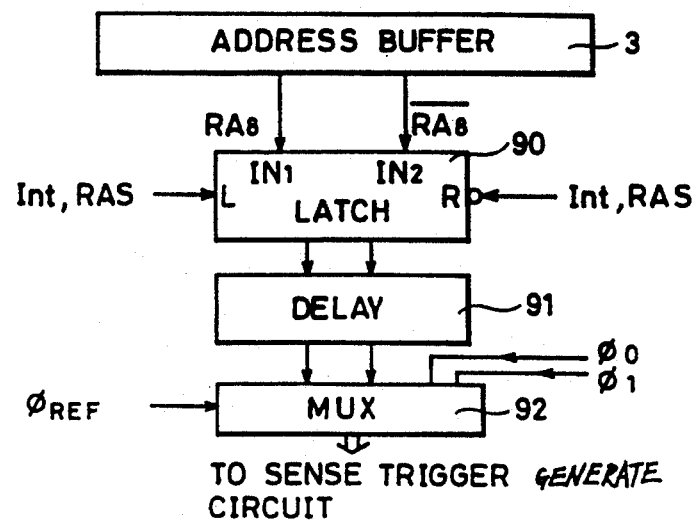
FIG. 25 represents a construction of a sense amplifier activating signal generating circuit.

FIG. 25 illustrates a construction of a circuit of a yet another embodiment of the invention. In FIG. 25, the sense amplifier activating signal generating circuit includes a latch circuit 90 which receives highest order address bit signals RA8 and $\overline{RA8}$ from the address buffer 3, a delay circuit 91 which delays an output of the latch circuit 90 by a predetermined time, and a multiplexer circuit 92 which allows selective passage of either the sense amplifier activating signal $\phi 0$ or $\phi 1$ and outputs of the delay circuit 91 in response to the refresh instruction detecting signal $\phi_{REF}$.

The latch circuit 90 responds to the internal signal Int.RAS for latching the complementary address signal bits RA8 and $\overline{RA8}$ applied to inputs IN1 and IN2 from the address buffer 3, and also responds to the falling of the internal signal Int.RAS for being reset to allow passage of the applied signals as applied. The delay circuit 91 delays the signal from the latch circuit 90 by a predetermined time. The multiplexer circuit 92 selects the output of the delay circuit 91 when the refresh instruction detecting signal $\phi_{REF}$ is generated, while it allows the passage of the sense amplifier activating signals $\phi 0$ and $\phi 1$ in the normal cycle. The output from the multiplexer circuit 92 is transmitted, as the sense amplifier activating signal, to the sense trigger generating circuit 20. During the refresh, the sense amplifier activating signals $\phi 0$ and $\phi 1$ are not generated.

In the construction shown in FIG. 25, signals which are formed by delaying the highest order address signal bits RA8 and $\overline{RA8}$ themselves can be used as the sense amplifier activating signals, and thus the power consumption of the sense amplifier activating signal generating circuitry can be reduced during the refresh.

Figure 26:
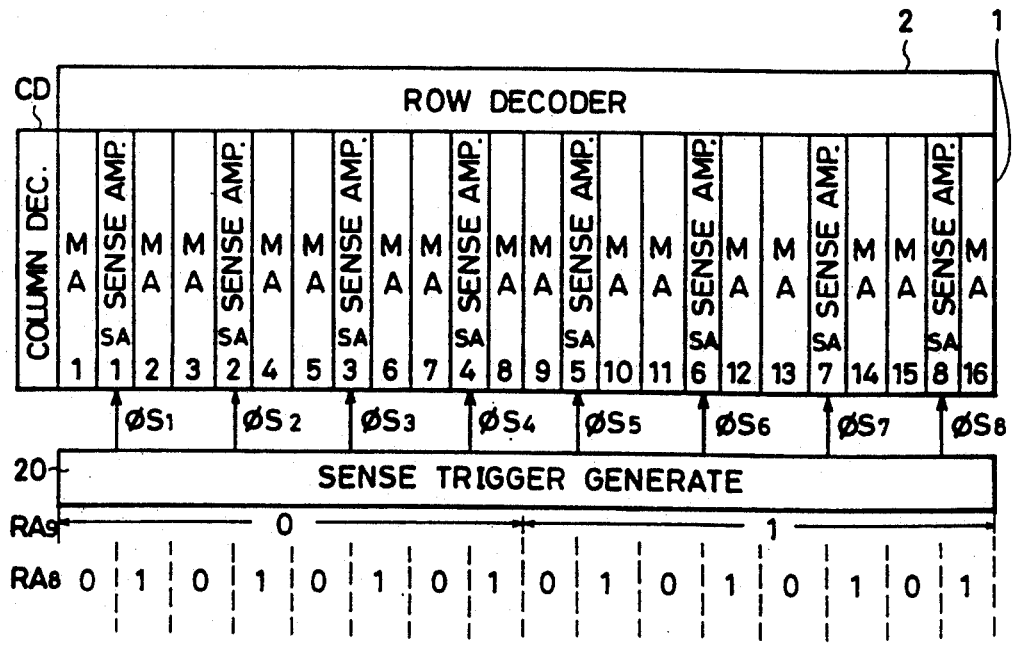
FIG. 26 illustrates another constructional example of a memory cell array in a semiconductor memory device according to the invention.

Further, in the semiconductor memory device shown in FIG. 14, the sense amplifier groups are provided in the respective memory cell blocks. However, the same advantages as the above embodiment provides can be obtained even in a dynamic type semiconductor memory device having a so-called "shared sense" construction shown in FIG. 26 in which two memory cell blocks commonly use a sense amplifier group. In FIG. 26, the memory cell array 1 is divided into 16 blocks MA1--MA16, and there is provided the sense amplifier groups SA1-SA8 each of which is commonly used by two memory cell blocks. The sense trigger generating circuit 20 applies the sense trigger signals $\phi s1-\phi s8$ to the sense amplifier groups SA1-SA8, respectively. In the semiconductor memory device of this shared sense construction, the memory cell array 1 is divided into two regions based on a highest order address signal bit RA9 (the memory cell array 1 is assumed to be 16 Mbits), and each region is further divided into two groups based on the next highest order address signal bit RA8. In this semiconductor memory device of the shared sense construction, the sense operation is performed for the cell blocks selected by the address signal bit RA9, and the unselected block groups are maintained in the standby state. In the group of the selected cell blocks, the memory cell blocks designated by the address signal bit RA8 are connected to the sense amplifier groups and the other unselected memory cell blocks are isolated from the sense amplifier groups. In this state, the sense amplifier groups perform the sense operation. Therefore, a plurality of sense amplifier groups are activated also in this case, so that the peak current during the refresh can be reduced by employing a construction in which the sense trigger signals are sequentially activated during the refresh.

According to the invention as described hereinabove, since there is provided the construction in which the sense amplifiers associated with the different memory cell blocks have the activation timings different from each other only in the refresh cycle operation, so that the refresh operation can be performed with the peak current less than that generated for the read and write of the data in the normal operation cycle, and thus the semiconductor memory device capable of reducing the load on the system power supply can be obtained.

Further, according to the invention, all the sense amplifiers are activated at the same timings in the normal operation, and the activation timings differ from each other only in the refresh operation, so that the peak current in the refresh cycle can be reduced without adversely affecting the access time in the normal operation.

Accordingly, the semiconductor memory device according to the invention can provide the memory system which can sufficiently fulfil the battery back-up function in a computer such as a portable personal computer having the battery back-up function.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic type semiconductor memory device comprising:
   m memory cell blocks each having a plurality of memory cells, said m being an integer;
   a plurality of sense amplifier groups associated with said memory cell blocks, one for each said cell block, and operable to sense and amplify information of selected memory cells in the associated memory cell blocks;
   means for generating a refresh instruction detecting signal providing the indication of a refresh mode in response to an externally applied refresh mode instruction signal; and
   sense amplifier activating means responsive to said refresh instruction detecting signal and a block selecting signal for activating all of the sense amplifier groups associated with the memory cell blocks selected by said block selecting signal, said block selecting signal simultaneously activating n memory cell blocks among said m memory cell blocks, said n being an integer not greater than said m,
   said sense amplifier activating means including means operable to sequentially activates the sense amplifier groups associated with said n memory cell blocks at different timings only when said refresh instruction detecting signal is active.

2. A dynamic type semiconductor memory device according to claim 1 further comprising:
   means for generating a refresh address in response to said refresh instruction mode signal;
   buffer means for receiving said refresh address for generating an internal row address; and
   means for transmitting a predetermined bit of said internal address, as said sense amplifier activating signal, to said sense amplifier activating means in response to said refresh instruction detecting signal.

3. A dynamic type semiconductor memory device comprising:
   a memory cell blocks each having a plurality of memory cells, said m being an integer;
   a plurality of sense amplifier groups associated with said memory cell blocks, one for each said cell block, and operable to sense and amplify information of selected memory cells in the associated memory cell blocks;
   means for generating a refresh instruction detecting signal providing the indication of a refresh mode in response to an externally applied refresh mode instruction signal; and
   sense amplifier activating means responsive to said refresh instruction detecting signal and a block selecting signal for activating all of the sense amplifier groups associated with the memory cell blocks selected by said block selecting signal, said block selecting signal simultaneously activating n memory cell blocks among said m memory cell blocks, said n being an integer not greater than said m, wherein
   said sense amplifier activating means includes
   means operable to sequentially activate the sense amplifier groups associated with said n memory cell blocks at different timings only when said refresh instruction detecting signal is active;
   sense amplifier activating signal generating means responsive to a memory cycle start indicating signal and said block selecting signal for generating a signal at a predetermined timing for activating the sense amplifier groups associated with said n memory cell blocks designated by said block selecting signal;
   a plurality of sense amplifier driving means associated with said plurality of sense amplifier groups, each said sense amplifier driving means operable to transmit said sense amplifier activating signal from said sense amplifier activating means to a corresponding sense amplifier group for activating the corresponding sense amplifier group; and
   enabling means for enabling said sense amplifier driving means at respectively different timings in response to said refresh instruction detecting signals, said enabling means including means for simultaneously enabling said plurality of sense amplifier driving means when said refresh instruction detecting signal is not generated.

4. A dynamic type semiconductor memory device according to claim 3, wherein said plurality of sense amplifier driving means each include an enable input for transmitting an applied sense amplifier activating signal when an activating signal is applied to said enable input; and
- said enabling means includes enable signal generating means for generating an enable signal in response to said refresh mode instruction signal and said refresh instruction detecting signal, and
- delay means for delaying said enable signal by predetermined times for sequential transmission thereof to respective said enable inputs of said plurality of sense amplifier driving means.

5. A dynamic type semiconductor memory device according to claim 4, wherein said enable signal generating means includes means for enabling all of said plurality of sense amplifier driving means by constantly generating said enable signal when said refresh mode instruction signal is not generated; and means for disabling respective said enable input of all of said plurality of sense amplifier driving means by generating a disable signal prior to generation of said enable signal when said refresh mode instruction signal is generated.

6. A semiconductor memory device used as an internal memory of a computer of a battery back-up type, comprising:
- m memory cell blocks each having a plurality of memory cells, said m being an integer;
- a plurality of sense amplifier groups each associated with each said memory cell block, and each operable to sense and amplify data of selected memory cells in the associated memory cell blocks;
- means for generating a refresh instruction detecting signal providing an indication of a refresh mode in response to an externally applied refresh mode instruction signal; and
- sense amplifier driving means for activating the sense amplifier groups associated with the memory cell blocks designated by a block designating signal in response to said block designating signal and refresh instruction detecting signal;
- said sense amplifier driving means including activating means for causing difference only in sense operation start timings of the sense amplifier groups only when said refresh instruction detecting signal is generated.

7. A semiconductor memory device according to claim 6, wherein said sense amplifier driving means includes means for generating a first sense amplifier activating signal at a predetermined timing in response to a memory cycle start indicating signal, and selecting means responsive to said block designating signal and said first sense amplifier activating signal for generating a second sense amplifier activating signal for activating only a sense amplifier group related to a memory cell block designated by said block designating signal, and wherein
- said activating means includes a plurality of gate means respectively associated with said sense amplifier groups, for generating trigger signals for driving the sense amplifier groups related thereto in response to said second sense amplifier activating signal and an enable signal, and means for applying said refresh instruction detecting signal as said enable signal to each said gate means, after delaying said refresh instruction detecting signal by different delay times for different gate means.

8. A method for refreshing a dynamic type semiconductor memory device including m memory blocks each having a plurality of memory cells, a plurality of sense amplifier groups respectively associated with said plurality of memory blocks, and being operable to sense and amplify data of selected memory cells in the memory blocks related thereto, said method comprising the steps of:
- generating a refresh instruction detecting signal in response to an externally applied refresh mode instruction signal;
- in response to said refresh instruction detecting signal and a block designating signal, activating the sense amplifier groups in such a manner that sense operation start timings of the sense amplifier groups related to the memory cell blocks designated by said block designating signal may differ from each other, while by inactivating the sense amplifier groups related to the memory cell blocks which are not designated by said block designated signal, said block designating signal simultaneously activating n memory blocks, said n being an integer not greater than said m; and
- simultaneously activating the sense amplifier groups related to said n memory blocks designated by said block designating signal when said refresh instruction detecting signal is not generated.

* * * * *